United States Patent [19]
Kon et al.

[11] Patent Number: 6,147,368
[45] Date of Patent: Nov. 14, 2000

[54] VOLTAGE-DRIVEN POWER SEMICONDUCTOR DEVICE

[75] Inventors: Hironobu Kon, Kawasaki; Yoshinoro Iwano, Yokohama; Mitsuhiko Kitagawa, Tokyo; Shigeru Hasegawa, Yokohama; Michiaki Hiyoshi, Yokohama, all of Japan

[73] Assignee: Kabushiki Kaisha Toshiba, Kawasaki, Japan

[21] Appl. No.: 09/115,238

[22] Filed: Jul. 14, 1998

[30] Foreign Application Priority Data

| | | | |
|---|---|---|---|
| Jul. 15, 1997 | [JP] | Japan | 9-190306 |
| Jul. 9, 1998 | [JP] | Japan | 10-194456 |

[51] Int. Cl.⁷ ............................ H01L 29/74; H01L 31/111
[52] U.S. Cl. .......................... 257/146; 257/177; 257/174; 257/531
[58] Field of Search ................... 257/146, 177, 257/173, 174, 175, 176, 531

[56] References Cited

U.S. PATENT DOCUMENTS

| | | | |
|---|---|---|---|
| 5,329,142 | 7/1994 | Kitagawa et al. | 257/139 |
| 5,448,083 | 9/1995 | Kitagawa et al. | 257/139 |
| 5,530,277 | 6/1996 | Otsuki et al. | 257/378 |
| 5,610,439 | 3/1997 | Hiyoshi et al. | 257/688 |
| 5,729,032 | 3/1998 | Tomomatsu et al. | 257/139 |

FOREIGN PATENT DOCUMENTS 44 29733 A1  3/1995  Germany.

OTHER PUBLICATIONS

Hideo Matsuda, "Pressure Contact Assembly Technology of High Power Devices," Power Semiconductor Devices and ICs, 1997.ISPSD '97 1997 IEEE International Symposium on, May 1997, pp. 17–24.

M. Kudoh, et al., "Current Sensing IGBT for Future Intellegent Power Module," Power Semiconductor Devices and I Cs, 1996.ISPSD '96 Proceedings., 8th International Symposium on, May 1996, pp303–306.

Mitsuhiko Kitagawa, et al., "A 4500V Injection Enhanced Insulated Gate Bipolar Transistor (IEGT) Operating in a Mode Similar to a Thyristor," IEDM, Dec. 1993, pp. 679–682.

Noriyuki Iwamuro, "A New Vertical IGBT Structure with a Monolithic Over–Current, Over–Voltage, and Over–Temperature Sensing and Protecting Circuit," IEEE Electron Device Lett., vol. 16, No. 9, Sep. 1995, pp. 399–401.

Yasukazu Seki, et al., "A New IGBT with a Monolithic Over–Current Protection Circuit," Proc. of the 6th Internat. Symposium on Power Semiconductor Davos, Switzerland, May 31–June 2, 1994, pp. 31–35.

Primary Examiner—John Guay
Attorney, Agent, or Firm—Oblon, Spivak, McClelland, Maier & Neustadt, P.C.

[57] ABSTRACT

A voltage-driven power semiconductor device includes a voltage-driven IEGT chip, a collector electrode plate, an emitter electrode plate, and an inductance material. The collector electrode plate is connected to the collector of the IEGT chip, and press-contacts the IEGT chip from its collector side. The emitter electrode plate press-contacts the IEGT chip from its emitter side. The inductance material has an inductance component and connects the emitter of the IEGT chip and the emitter electrode plate. In the voltage-driven power semiconductor device having this arrangement, an induced electromotive force is generated in the inductance material arranged between the emitter of the IEGT chip and the emitter electrode plate. This induced electromotive force can suppress a steep current change (di/dt) upon an OFF operation, and can further suppress a steep voltage change (dv/dt) caused by the current change (di/dt).

25 Claims, 18 Drawing Sheets

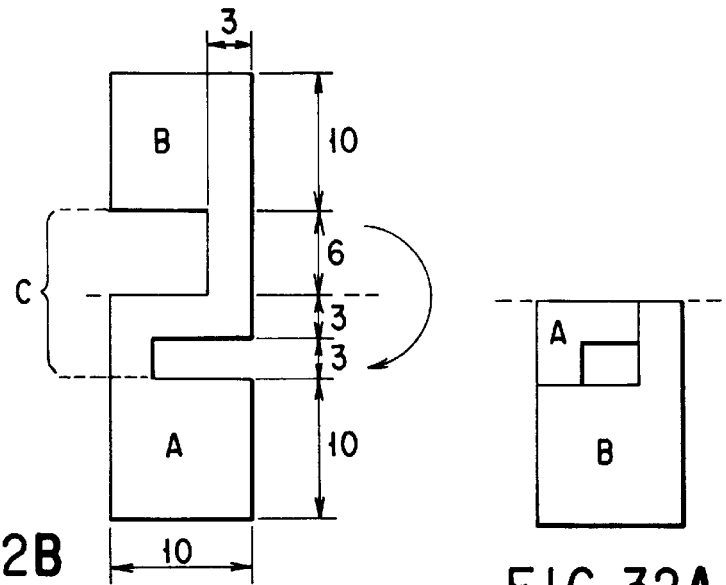
FIG. 32B  FIG. 32A
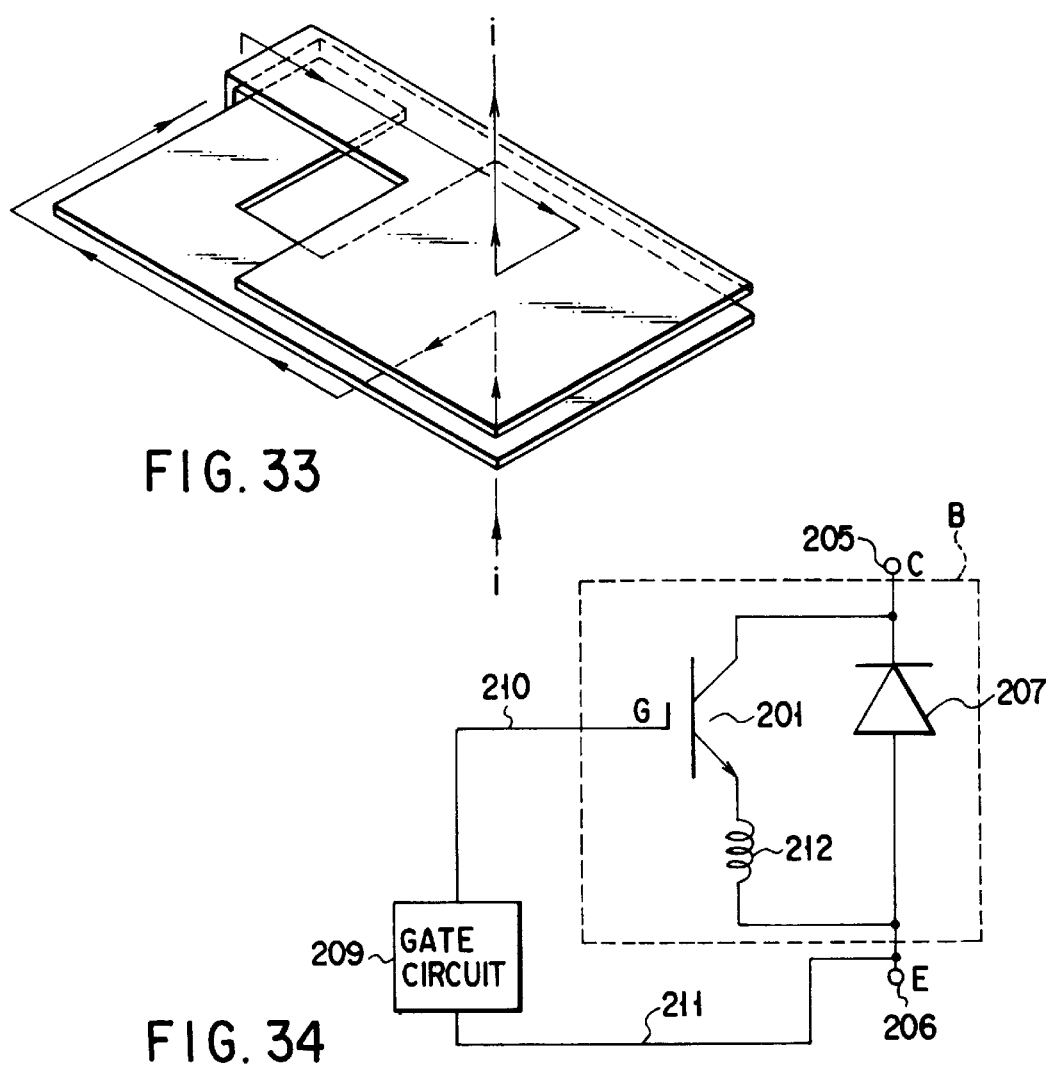
FIG. 33
FIG. 34

VOLTAGE-DRIVEN POWER SEMICONDUCTOR DEVICE

BACKGROUND OF THE INVENTION

1. Field of the Invention

The present invention relates to a voltage-driven power semiconductor device constituted by press-contacting and connecting a plurality of voltage-driven power semiconductor elements parallel to each other and, more particularly, to an internal package structure and connection method for a voltage-driven power semiconductor device using a power semiconductor element with an enhanced emitter-side carrier accumulation effect.

2. Discussion of the Background

The power semiconductor device has widely been used for power conversion and power control of an inverter, a converter, and the like, and is indispensable in the field of power applications. In recent years, the power semiconductor device is required to attain a large capacity and a high switching speed along with a large power capacity and RF switching.

An example of a large-capacity power semiconductor device is a current-driven power semiconductor device represented by a gate turn-off thyristor (to be referred to as a GTO hereinafter). However, the GTO poses problems in device downsizing, RF switching, and the like. Instead, voltage-driven power semiconductor devices represented by an insulated gate bipolar transistor (to be referred to as an IGBT hereinafter) are being popular.

However, the IGBT has not attained a capacity as large as the capacity of the GTO. For this reason, an injection enhanced gate transistor (to be referred to as an IEGT hereinafter) has recently been developed as a large-capacity voltage-driven power semiconductor device capable of performing RF switching, and receives a great deal of attention as a post GTO.

A conventional press-contacting electrode type IEGT package will be explained. FIG. 1 is a sectional view showing an example of the conventional press-contacting electrode type IEGT package structure. FIG. 2 is a circuit diagram showing the electrical arrangement of the press-contacting electrode type IEGT package. The broken line B in FIGS. 1 and 2 indicates a portion corresponding to the IEGT package.

As shown in FIGS. 1 and 2, power semiconductor elements (IEGT chips) 300a to 300d and a free wheeling diode (to be referred to as an FWD hereinafter) chip 310a are press-contacted from the top by a collector (anode) press-contacting electrode plate 330 and from the bottom by an emitter (cathode) press-contacting electrode plate 340 via molybdenum plates 320a to 320f.

Copper posts respectively press-contacting the IEGT chips 300a to 300d have gate pins 350a to 350d. The gate pins 350a to 350d are connected by a gate line 370 to a gate circuit 360 outside the press-contacting electrode type IEGT package. The gate circuit 360 is connected to the emitter press-contacting electrode plate 340 by an emitter line 380.

The press-contacting electrode type IEGT package having this structure can advantageously decrease the inductance component of a connection medium between the collector press-contacting electrode plate (external terminal) 330 and the collectors of the IEGT chips 300a to 300d. Similarly, it can decrease the inductance component of a connection medium between the emitter press-contacting electrode plate (external terminal) 340 and the emitters of the IEGT chips 300a to 300d.

The IEGT chip has a gate resistor with a relatively large resistance value in order to suppress a turn-off voltage change (dv/dt). Accordingly, in the IEGT chip, the gate current is small, and the Miller effect time is long. The resistance value of the gate resistor is set to satisfy the following relation: IEGT chip element active area $[cm^2] \times Rg [\Omega] > 20$. Further, the IEGT has a much larger MOS gate electrostatic capacitance than the IGBT, and greatly changes in capacity with a collector-emitter voltage Vce.

IEGT chips, therefore, significantly differ in input capacity upon reception of an OFF signal at the gate owing to a slight difference in reverse charging of the input capacity just before an OFF operation. The gate voltages of the IEGT chips oscillate. The oscillating gate voltage greatly oscillates the IEGT element current to cause a steep current change (di/dt) in an OFF operation. This current changes may cause an abrupt voltage change (dv/dt) to destruct the IEGT chip.

The IEGT has a much higher energization ability than the IGBT. For this reason, when an excessive element current flows to cause, e.g., short-circuiting, the IEGT must be protected more reliably than the IGBT from the excessive current in order to prevent serious damage.

BRIEF SUMMARY OF THE INVENTION

The present invention has been made in consideration of the conventional drawbacks, and has as its object to provide a voltage-driven semiconductor device which is constituted by press-contacting voltage-driven power semiconductor elements, can improve the current balance between IEGT elements upon switching the IEGTs, can suppress a voltage change (dv/dt) and a current change (di/dt), and can increase the breakdown voltage.

It is another object of the present invention to provide a voltage-driven power semiconductor device capable of abruptly improving an excessive current protective function.

To achieve the above objects, a voltage-driven power semiconductor device according to the present invention comprises a voltage-driven power semiconductor element, a collector electrode connected to a collector of the power semiconductor element, and connection means with an inductance component for connecting an emitter of the power semiconductor element and an emitter electrode.

In the voltage-driven power semiconductor device having this arrangement, a steep current change (di/dt) upon an OFF operation generates an induced electromotive force in the connection means in a current blocking direction. This induced electromotive force reversely biases the gate voltage. Therefore, the induced electromotive force can suppress the steep current change (di/dt) upon an OFF operation, and can further suppress an abrupt voltage change (dv/dt) caused by the current change (di/dt). The power semiconductor element can be prevented from destruction.

A voltage-driven power semiconductor device according to the present invention comprises a voltage-driven power semiconductor element, a collector electrode plate which is connected to a collector of the power semiconductor element and press-contacts the power semiconductor element from the collector side, an emitter electrode plate for press-contacting the power semiconductor element from an emitter side of the power semiconductor element, and connection means with an inductance component for connecting the emitter of the power semiconductor element and the emitter electrode plate.

In the voltage-driven power semiconductor device having this arrangement, a steep current change (di/dt) upon an OFF operation generates an induced electromotive force in the connection means in a current blocking direction. This induced electromotive force becomes a reverse bias against the gate voltage. Accordingly, the induced electromotive force can suppress the steep current change (di/dt) upon an OFF operation, and can further suppress an abrupt voltage change (dv/dt) caused by the current change (di/dt). The power semiconductor element can be prevented from destruction.

A voltage-driven power semiconductor device according to the present invention comprises a plurality of voltage-driven power semiconductor elements, a collector electrode plate which is connected to collectors of the plurality of power semiconductor elements and press-contacts the power semiconductor elements from the collector side, an emitter electrode plate for press-contacting the power semiconductor elements from an emitter side of the plurality of power semiconductor elements, and a plurality of connection means with inductance components for connecting the emitters of the plurality of power semiconductor elements and the emitter electrode plate.

In the voltage-driven power semiconductor device having this arrangement, current oscillation between power semiconductor elements immediately before an OFF operation generates an induced electromotive force in the connection means in a current blocking direction. This electromotive force reversely biases the gate voltage. Further, a steep current change (di/dt) upon an OFF operation generates a similar induced electromotive force in the connection means. These induced electromotive forces can suppress current oscillation between power semiconductor elements immediately before an OFF operation, and can also suppress an abrupt current change (di/dt) caused by the current change (di/dt). Even in a multipellet power semiconductor device, the power semiconductor element can be prevented from destruction.

The voltage-driven power semiconductor device according to the present invention further comprises a gate circuit connected to a gate of the power semiconductor element and the emitter electrode plate to apply a driving voltage to the gate and control operation of the power semiconductor element.

In the voltage-driven power semiconductor device having this arrangement, a steep current change (di/dt) upon an OFF operation generates an induced electromotive force in the connection means in a current blocking direction. This induced electromotive force reversely biases the gate voltage. By applying, to the gate, a voltage corresponding to a voltage drop in the connection means, the steep current change (di/dt) upon an OFF operation and an abrupt voltage change (dv/dt) caused by the current change (di/dt) can be suppressed. Consequently, the power semiconductor element can be prevented from destruction.

In the voltage-driven power semiconductor device according to the present invention, the power semiconductor element comprises a current sense terminal, and the device further comprises a protective circuit for protecting the power semiconductor element in response to a sense signal output from the current sense terminal.

In the voltage-driven power semiconductor device having this arrangement, a steep current change (di/dt) upon generation of an excessive current generates an induced electromotive force in the connection means in a current blocking direction. This electromotive force reversely biases the gate voltage. The induced electromotive force can suppress the steep current change (di/dt) upon an OFF operation, and can further suppress an abrupt voltage change (dv/dt) caused by the current change (di/dt). When an excessive current flows into the power semiconductor element, the protective circuit protects the power semiconductor element from destruction. In this manner, the power semiconductor element can be stably protected from an excessive current and can be prevented from destruction.

In the voltage-driven power semiconductor device according to the present invention, the power semiconductor element is an IEGT (Injection Enhanced Gate Transistor).

The voltage-driven power semiconductor device having this arrangement can attain a large processing power capacity and RF switching.

In the voltage-driven power semiconductor device according to the present invention, the connection means has an inductance component of not more than 100 nH.

In the voltage-driven power semiconductor device having this arrangement, although the inductance component depends on the rated gate voltage, the circuit arrangement, and the like, its proper value is set to 100 nH or less on the basis of the experimental results of the current change (di/dt) upon an OFF operation or generation of an excessive current. The inductance component experimentally suffices to be 0.1 nH or more.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 32A is a plan view of an inductance material formed from a thin copper plate;

FIG. 32B is a developed view of the inductance material;

FIG. 33 is a perspective view of the inductance material;

FIG. 34 is a circuit diagram showing the electrical arrangement of the power semiconductor device according to the 12th embodiment;

DETAILED DESCRIPTION OF THE INVENTION

Figure 1:
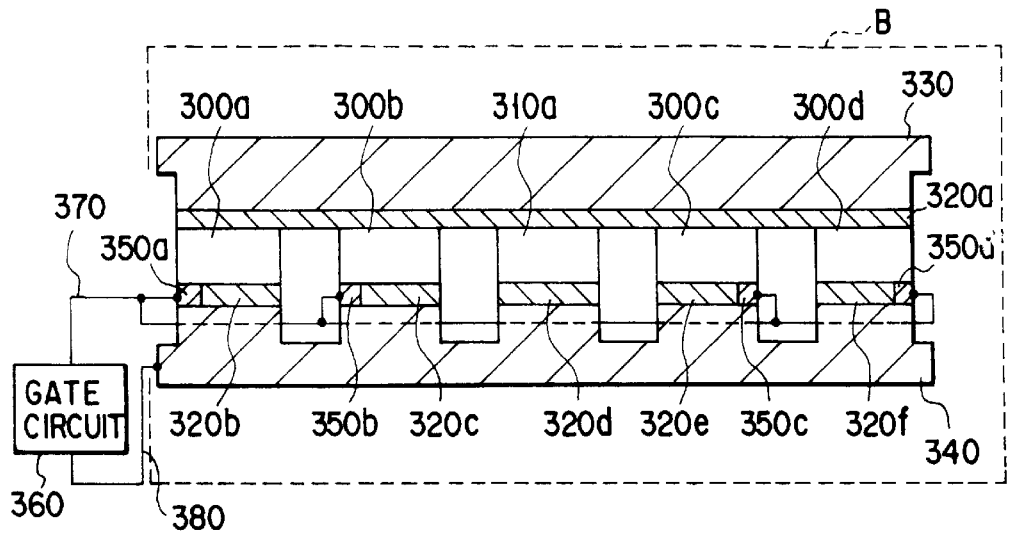
FIG. 1 is a sectional view showing an example of the structure of a conventional press-contacting electrode type IEGT package.
Figure 2:
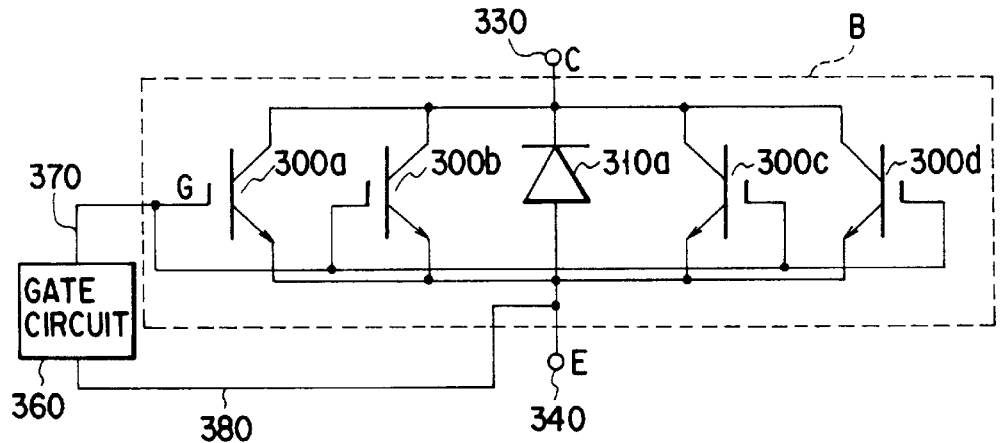
FIG. 2 is a circuit diagram showing the electrical arrangement of the conventional press-contacting electrode type IEGT package.

A voltage-driven power semiconductor device according to the first embodiment of the present invention will be described below. This voltage-driven power semiconductor device is a press IEGT package constituted by press-contacting a plurality of IEGT chips and a plurality of FWD chips by a pair of press-contacting electrode plates. The IEGT chips are power semiconductor elements. The FWD chips are parallel-connected to the IEGT chips in a reverse energization direction. In this embodiment, the voltage-driven power semiconductor device will be explained with reference to a sectional view of a press IEGT package constituted by one IEGT chip and one FWD chip. The broken line B indicates a portion corresponding to the IEGT package throughout the drawing.

Figure 3:
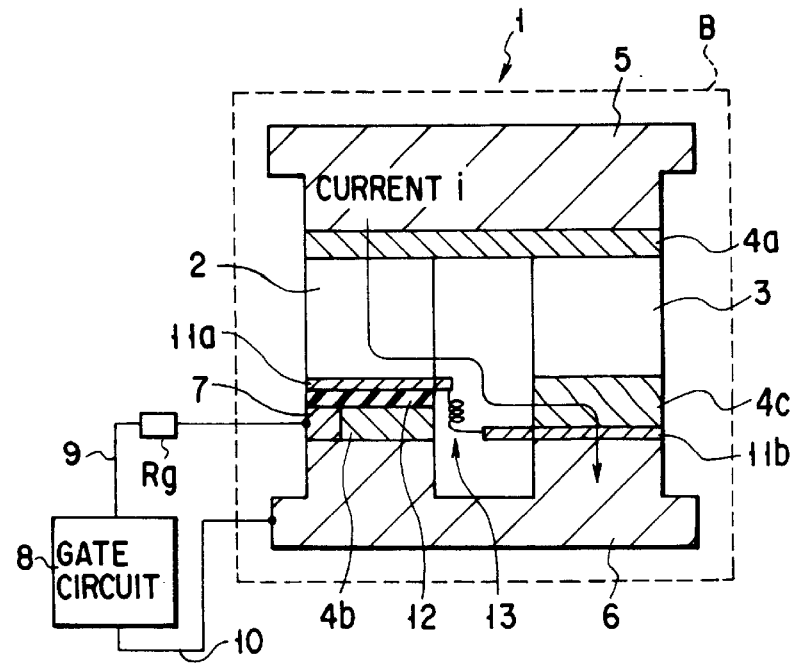
FIG. 3 is a sectional view showing the structure of a power semiconductor device according to the first embodiment of the present invention.

FIG. 3 is a sectional view showing the arrangement of the voltage-driven power semiconductor device according to the first embodiment of the present invention. A voltage-driven power semiconductor device 1 has the following arrangement.

As shown in FIG. 3, an IEGT chip 2 and an FWD chip 3 are press-contacted from the top by a collector (anode) press-contacting electrode plate 5 via a molybdenum plate 4a and from the bottom by an emitter (cathode) press-contacting electrode plate 6 via molybdenum plates 4b and 4c.

The gate of the IEGT chip 2 is connected to a gate pin 7. The gate pin 7 is connected by a gate line 9 to a gate circuit 8 for driving the IEGT chip 2. The gate circuit 8 is connected to the emitter press-contacting electrode plate 6 by an emitter line 10.

A thin copper plate 11a and a thin insulating plate 12 are sandwiched between the emitter of the IEGT chip 2 and the molybdenum plate 4b. A thin copper plate 11b is sandwiched between the molybdenum plate 4c and the emitter press-contacting electrode plate 6. An inductance material 13 having an inductance component of 100 nH or less is arranged between the thin copper plate 11a connected to the emitter of the IEGT chip 2 and the thin copper plate 11b connected to the emitter press-contacting electrode plate 6.

A forward current i in the power semiconductor device shown in FIG. 3 flows through the collector press-contacting electrode plate 5, the molybdenum plate 4a, the IEGT chip 2, the thin copper plate 11a, the inductance material 13, the thin copper plate 11b, and the emitter press-contacting electrode plate 6, as indicated by the arrow.

Figure 4:
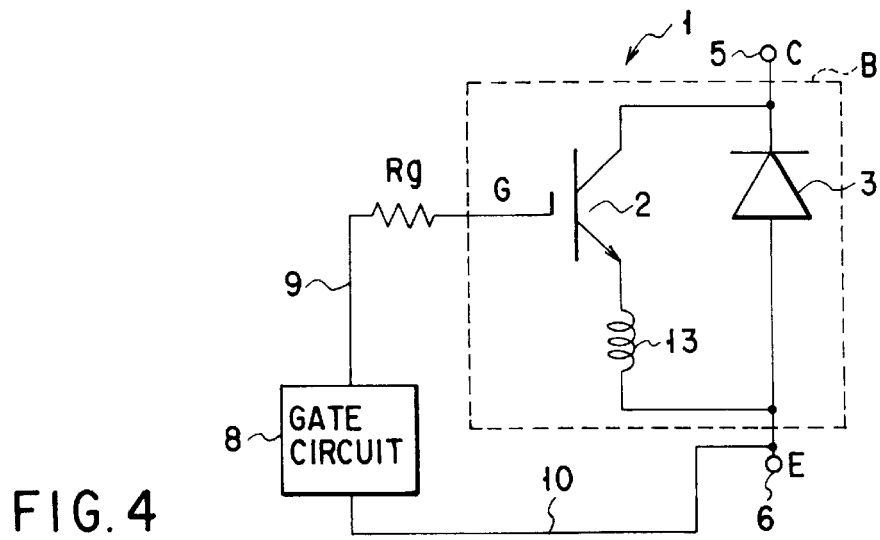
FIG. 4 is a circuit diagram showing the electrical arrangement of the power semiconductor device according to the first embodiment.

FIG. 4 is a circuit diagram showing the electrical arrangement of the voltage-driven power semiconductor device according to the first embodiment. The collector press-contacting electrode plate 5 is connected to the collector of the IEGT chip 2 and the cathode of the FWD chip 3. The emitter press-contacting electrode plate 6 is connected to the inductance material 13 connected to the emitter of the IEGT chip 2, and the anode of the FWD chip 3. The gate line 9 connected to the gate circuit 8 is connected to the gate of the IEGT chip 2 via a gate resistor Rg. The emitter line 10 connected to the gate circuit 8 is connected to the emitter press-contacting electrode plate 6.

In the voltage-driven power semiconductor device having the arrangement shown in FIGS. 3 and 4, a steep current change (di/dt) upon turning off the IEGT chip 2 generates an induced electromotive force in the inductance material 13 in a direction in which the current flowing through the inductance material 13 is blocked. This induced electromotive force reversely biases the voltage applied to the gate of the IEGT chip 2.

According to the first embodiment, the induced electromotive force generated in the inductance material 13 arranged between the emitter of the IEGT chip 2 and the emitter press-contacting electrode plate 6 can suppress the steep current change (di/dt) upon an OFF operation, and can further suppress a steep voltage change (dv/dt) caused by the current change (di/dt). Accordingly, the IEGT chip 2 can be prevented from destruction.

A voltage-driven power semiconductor device according to the second embodiment of the present invention will be described below. Similar to the first embodiment, this voltage-driven power semiconductor device is a press IEGT package constituted by press-contacting a plurality of IEGT chips and a plurality of FWD chips by a pair of press-contacting electrode plates. The IEGT chips are power semiconductor elements. The FWD chips are parallel-connected to the IEGT chips in a reverse energization direction. In the second embodiment, the voltage-driven power semiconductor device will be explained with reference to a sectional view of a press IEGT package constituted by one IEGT chip and one FWD chip.

Figure 5:
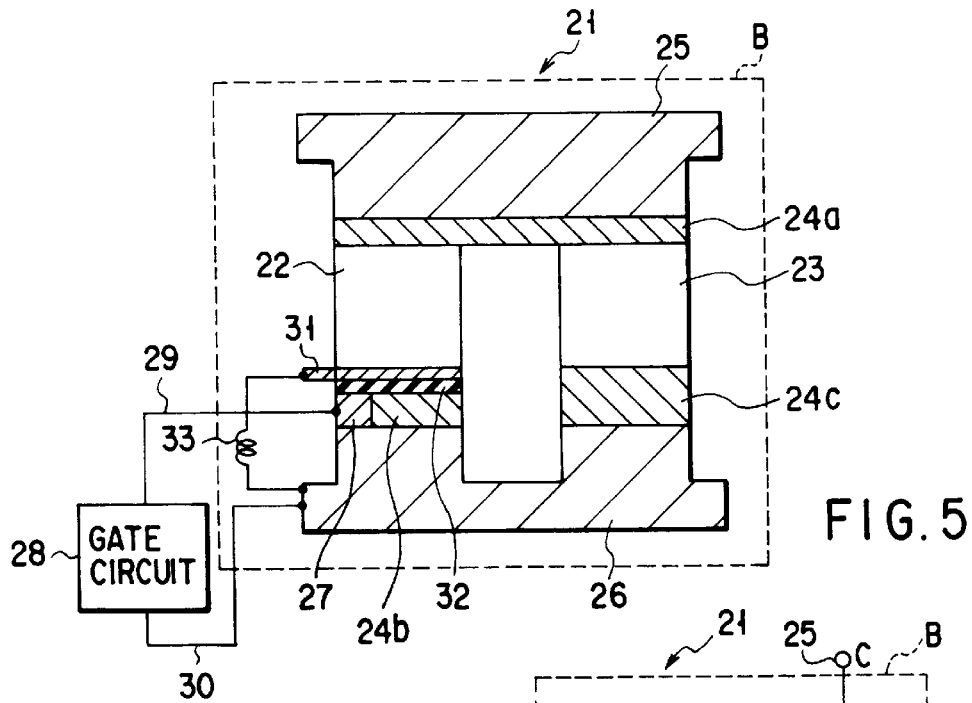
FIG. 5 is a sectional view showing the structure of a power semiconductor device according to the second embodiment of the present invention.

FIG. 5 is a sectional view showing the arrangement of the voltage-driven power semiconductor device according to the second embodiment of the present invention. A voltage-driven power semiconductor device 21 has the following arrangement.

As shown in FIG. 5, an IEGT chip 22 and an FWD chip 23 are press-contacted from the top by a collector (anode) press-contacting electrode plate 25 via a molybdenum plate 24a and from the bottom by an emitter (cathode) press-contacting electrode plate 26 via molybdenum plates 24b and 24c.

The gate of the IEGT chip 22 is connected to a gate pin 27. The gate pin 27 is connected by a gate line 29 to a gate circuit 28 for driving the IEGT chip 22. The gate circuit 28 is connected to the emitter press-contacting electrode plate 26 by an emitter line 30.

A thin copper plate 31 and a thin insulating plate 32 are sandwiched between the emitter of the IEGT chip 22 and the molybdenum plate 24b. An inductance material 33 having an inductance component of 100 nH or less is arranged between the thin copper plate 31 connected to the emitter of the IEGT chip 22 and the emitter press-contacting electrode plate 26.

Figure 6:
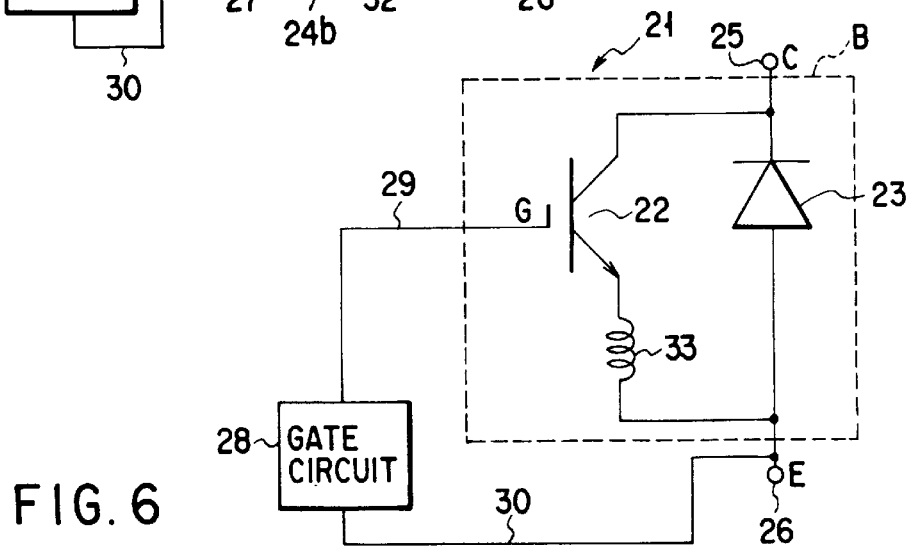
FIG. 6 is a circuit diagram showing the electrical arrangement of the power semiconductor device according to the second embodiment.

FIG. 6 is a circuit diagram showing the electrical arrangement of the voltage-driven power semiconductor device according to the second embodiment. The circuit arrangement in the second embodiment is the same as that in the first embodiment. The collector press-contacting electrode plate 25 is connected to the collector of the IEGT chip 22 and the cathode of the FWD chip 23. The emitter press-contacting electrode plate 26 is connected to the inductance material 33 connected to the emitter of the IEGT chip 22, and the anode of the FWD chip 23. The gate line 29 connected to the gate circuit 28 is connected to the gate of the IEGT chip 22. The emitter line 30 connected to the gate circuit 28 is connected to the emitter press-contacting electrode plate 26.

In the voltage-driven power semiconductor device having the arrangement shown in FIGS. 5 and 6, a steep current change (di/dt) upon turning off the IEGT chip 22 generates an induced electromotive force in the inductance material 33 in a direction in which the current flowing through the inductance material 33 is blocked. This induced electromotive force reversely biases the voltage applied to the gate of the IEGT chip 22.

According to the second embodiment, the induced electromotive force generated in the inductance material 33 arranged between the emitter of the IEGT chip 22 and the emitter press-contacting electrode plate 26 can suppress the steep current change (di/dt) upon an OFF operation, and can further suppress a steep voltage change (dv/dt) caused by the current change (di/dt). Accordingly, the IEGT chip 22 can be prevented from destruction.

A voltage-driven power semiconductor device according to the third embodiment of the present invention will be described below. Similar to the first embodiment, this voltage-driven power semiconductor device is a press IEGT package constituted by press-contacting a plurality of IEGT chips and a plurality of FWD chips by a pair of press-contacting electrode plates. The IEGT chips are power semiconductor elements. The FWD chips are parallel-connected to the IEGT chips in a reverse energization direction.

Figure 7:
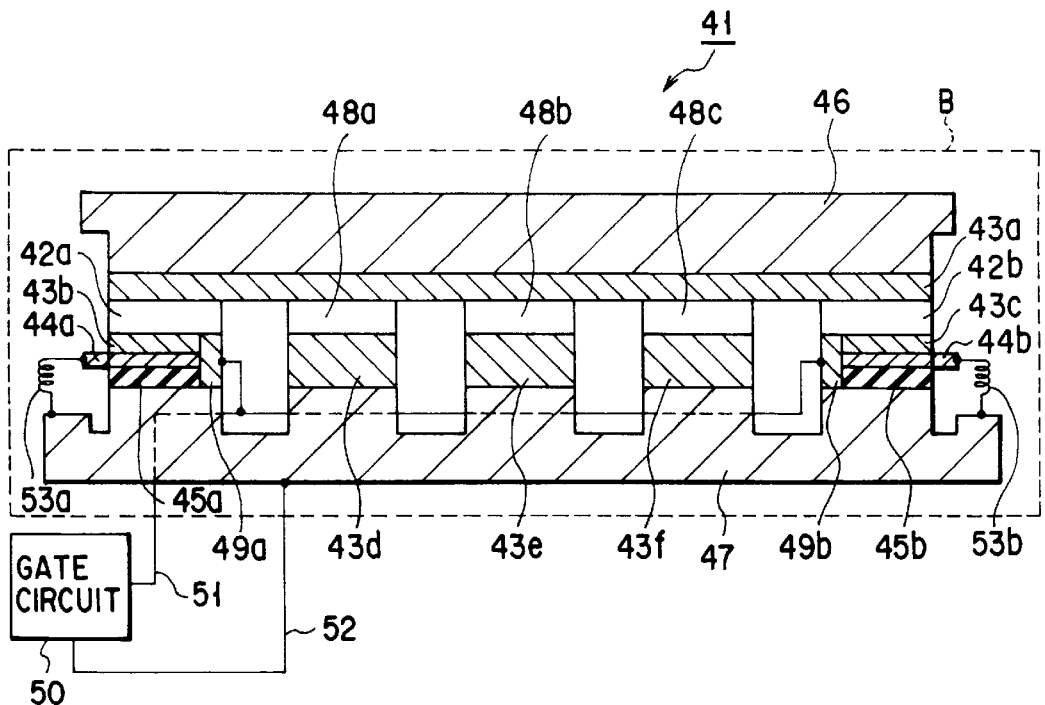
FIG. 7 is a sectional view showing the structure of a power semiconductor device according to the third embodiment of the present invention.

FIG. 7 is a sectional view showing the arrangement of the voltage-driven power semiconductor device according to the third embodiment of the present invention. A voltage-driven power semiconductor device 41 has the following arrangement.

As shown in FIG. 7, IEGT chips 42a and 42b are press-contacted from the top by a collector (anode) press-contacting electrode plate 46 via a molybdenum plate 43a and from the bottom by an emitter (cathode) press-contacting electrode plate 47 via molybdenum plates 43b and 43c, thin copper plates 44a and 44b, and thin insulating plates 45a and 45b. Similarly, FWD chips 48a, 48b, and 48c are press-contacted from the top by the collector press-contacting electrode plate 46 via the molybdenum plate 43a and from the bottom by the emitter press-contacting electrode plate 47 via molybdenum plates 43d, 43e, and 43f.

The gates of the IEGT chips 42a and 42b are respectively connected to gate pins 49a and 49b. The gate pins 49a and 49b are connected by a gate line 51 to a gate circuit 50 for driving the IEGT chips 42a and 42b. The gate circuit 50 is connected to the emitter press-contacting electrode plate 47 by an emitter line 52.

Inductances 53a and 53b each having an inductance component of 100 nH or less are respectively arranged between the thin copper plates 44a and 44b connected to the emitters of the IEGT chips 42a and 42b and the emitter press-contacting electrode plate 47.

Figure 8:
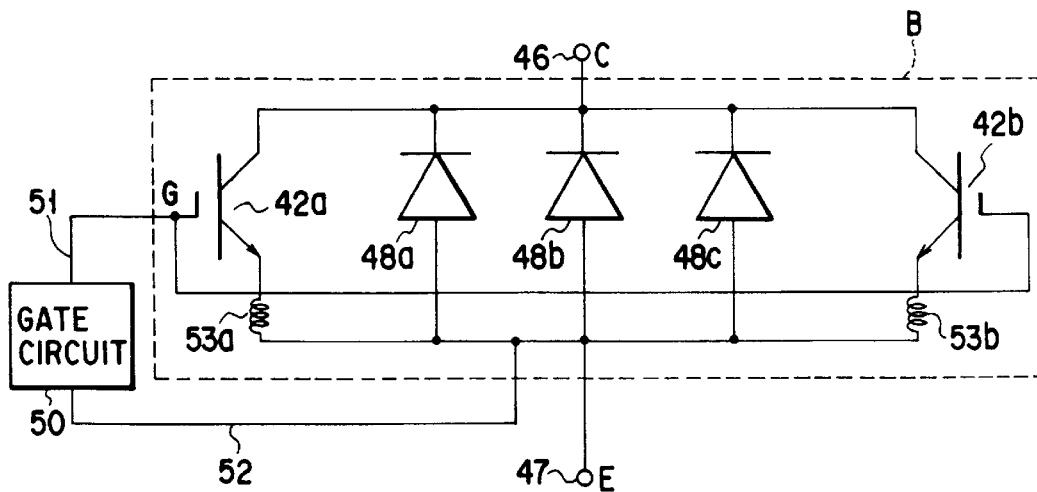
FIG. 8 is a circuit diagram showing the electrical arrangement of the power semiconductor device according to the third embodiment.

FIG. 8 is a circuit diagram showing the electrical arrangement of the voltage-driven power semiconductor device according to the third embodiment.

As shown in FIG. 8, the collector press-contacting electrode plate 46 is connected to the collectors of the IEGT chips 42a and 42b and the cathodes of the FWD chips 48a, 48b, and 48c. The emitter press-contacting electrode plate 47 is connected to the inductances 53a and 53b respectively connected to the emitters of the IEGT chips 42a and 42b, and the anodes of the FWD chips 48a, 48b, 48c.

The gate line 51 connected to the gate circuit 50 is connected to the gates of the IEGT chips 42a and 42b. The emitter line 52 connected to the gate circuit 50 is connected to the emitter press-contacting electrode plate 47.

In the voltage-driven power semiconductor device having the arrangement shown in FIGS. 7 and 8, a steep current change (di/dt) upon turning off the IEGT chips 42a and 42b generates an induced electromotive force in the inductances 53a and 53b in a direction in which the current flowing through the inductances 53a and 53b is blocked. This induced electromotive force reversely biases the voltage applied to the gates of the IEGT chips 42a and 42b.

According to the third embodiment, the induced electromotive force generated in the inductances 53a and 53b arranged between the emitters of the IEGT chips 42a and 42b and the emitter press-contacting electrode plate 47 can suppress the steep current change (di/dt) upon an OFF operation, and can further suppress a steep voltage change (dv/dt) caused by the current change (di/dt). Accordingly, the IEGT chips 42a and 42b can be prevented from destruction.

A voltage-driven power semiconductor device according to the fourth embodiment of the present invention will be described below. Similar to the first embodiment, this voltage-driven power semiconductor device is a press IEGT package constituted by press-contacting a plurality of IEGT chips and a plurality of FWD chips by a pair of press-contacting electrode plates. The IEGT chips are power semiconductor elements. The FWD chips are parallel-connected to the IEGT chips in a reverse energization direction.

Figure 9:
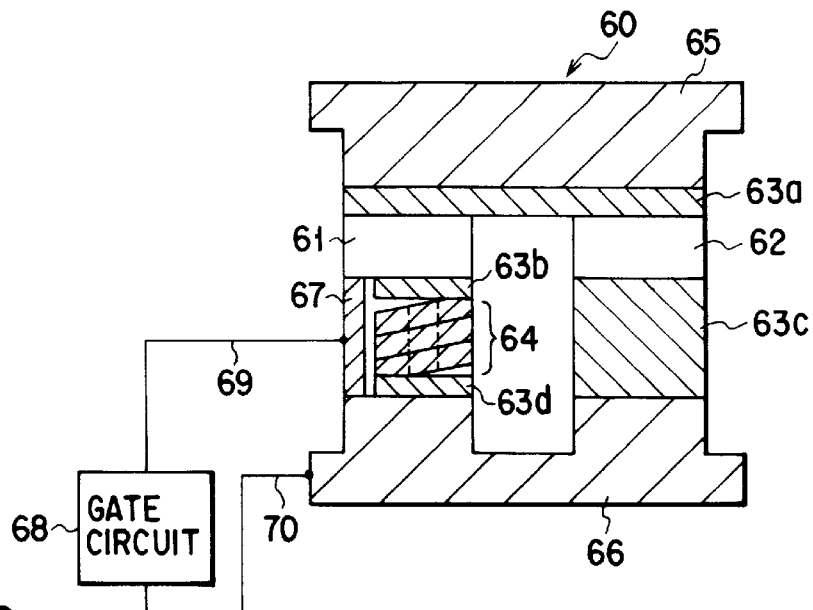
FIG. 9 is a sectional view showing the structure of a power semiconductor device according to the fourth embodiment of the present invention.

FIG. 9 is a sectional view showing the arrangement of the voltage-driven power semiconductor device according to the fourth embodiment of the present invention. A voltage-driven power semiconductor device 60 has the following arrangement.

As shown in FIG. 9, a molybdenum plate 63a is arranged on an IEGT chip 61 and an FWD chip 62. A molybdenum plate 63b is arranged below the IEGT chip 61, whereas a molybdenum plate 63c is arranged below the FWD chip 62. A spiral emitter pin 64 having an inductance component of 100 nH or less and a molybdenum plate 63d are arranged below the molybdenum plate 63b.

The IEGT chip 61 and the FWD chip 62 are press-contacted from the top a collector (anode) press-contacting electrode plate 65 via the molybdenum plate 63a and from the bottom by an emitter (cathode) press-contacting electrode plate 66 via the molybdenum plate 63d, the spiral emitter pin 64, and the molybdenum plates 63b and 63c.

The gates of the IEGT chip 61 is connected to a gate pin 67. The gate pin 67 is connected by a gate line 69 to a gate circuit 68 for driving the IEGT chip 61. The gate circuit 68 is connected to the emitter press-contacting electrode plate 66 by an emitter line 70.

Figure 10A:
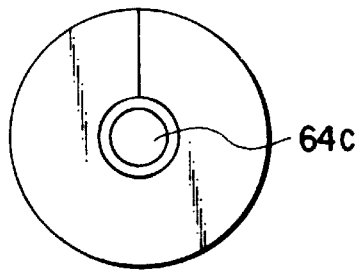
FIG. 10A is a plan view of a spiral emitter pin viewed from above.
Figure 10B:
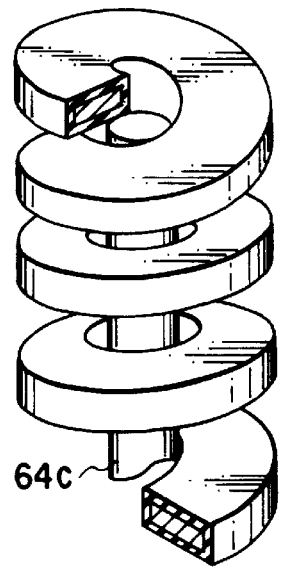
FIG. 10B is a perspective view of the spiral emitter pin viewed obliquely from above.
Figure 11:
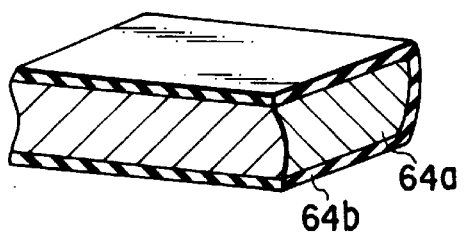
FIG. 11 is a sectional view showing the internal structure of the spiral emitter pin.

The spiral emitter pin 64 will be explained in more detail. FIG. 10A is a plan view of the spiral emitter pin 64 viewed from above. FIG. 10B is a perspective view of the spiral emitter pin 64 viewed obliquely from above. FIG. 11 is a sectional view showing the internal structure of the spiral emitter pin 64.

As shown in FIG. 10B, the spiral emitter pin 64 is obtained by spirally winding a plate-like member, and is elastic in a vertical direction in FIG. 10B. The plate-like member is prepared by covering a conductor 64a with an insulator 64b.

A core 64c having a predetermined permeability is inserted in the center of the spiral formed by the spiral emitter pin 64. By selecting the permeability of the core 64c, the spiral emitter pin 64 can be given a desired inductance component.

Those portions of the spiral emitter pin 64 which are in contact with the molybdenum plates 63b and 63d are not covered with the insulator 64b, and are electrically connected to the molybdenum plates 63b and 63d. The spiral emitter pin 64 operates as a spring for properly pressurizing the IEGT chip 61 upon press contacting, and can uniformly press a plurality of IEGT chips.

The power semiconductor device according to the fourth embodiment has the same electrical arrangement as that in the first embodiment. That is, the collector press-contacting electrode plate 65 is connected to the collector of the IEGT chip 61 and the cathode of the FWD chip 62. The emitter press-contacting electrode plate 66 is connected to the spiral emitter pin 64 connected to the emitter of the IEGT chip 61, and the anode of the FWD chip 62. The gate line 69 connected to the gate circuit 68 is connected to the gate of the IEGT chip 61. The emitter line 70 connected to the gate circuit 68 is connected to the emitter press-contacting electrode plate 66.

In the voltage-driven power semiconductor device having the arrangement shown in FIG. 9, a steep current change (di/dt) upon turning off the IEGT chip 61 generates an induced electromotive force in the spiral emitter pin 64 in a direction in which the current flowing through the spiral emitter pin 64 is blocked. This induced electromotive force reversely biases the voltage applied to the gates of the IEGT chip 61.

According to the fourth embodiment, the induced electromotive force generated in the spiral emitter pin 64 arranged between the emitter of the IEGT chip 61 and the emitter press-contacting electrode plate 66 can suppress the steep current change (di/dt) upon an OFF operation, and can further suppress a steep voltage change (dv/dt) caused by the current change (di/dt). Accordingly, the IEGT chip 61 can be prevented from destruction.

In addition, since the spiral emitter pin 64 operates as a spring in press contacting by the collector press-contacting electrode plate 65 and the emitter press-contacting electrode plate 66, a plurality of IEGT chips can be uniformly press-contacted. Furthermore, the spiral emitter pin 64 can be given a desired inductance component by replacing the core 64c inserted in the center of the spiral formed by the spiral emitter pin 64, and changing the permeability of the core 64c.

A voltage-driven power semiconductor device according to the fifth embodiment of the present invention will be described below. Similar to the first embodiment, this voltage-driven power semiconductor device is a press IEGT package constituted by press-contacting a plurality of IEGT chips and a plurality of FWD chips by a pair of press-contacting electrode plates. The IEGT chips are power semiconductor elements. The FWD chips are parallel-connected to the IEGT chips in a reverse energization direction.

In the fourth embodiment, the spiral emitter pin is arranged on the emitter side of the IEGT chip. In the fifth embodiment, a spiral conductor like the one shown in FIG. 10B is arranged on the gate line side of the gate. In the fifth embodiment, the voltage-driven power semiconductor device will be explained with reference to a sectional view of a press IEGT package constituted by one IEGT chip and one FWD chip.

Figure 12:
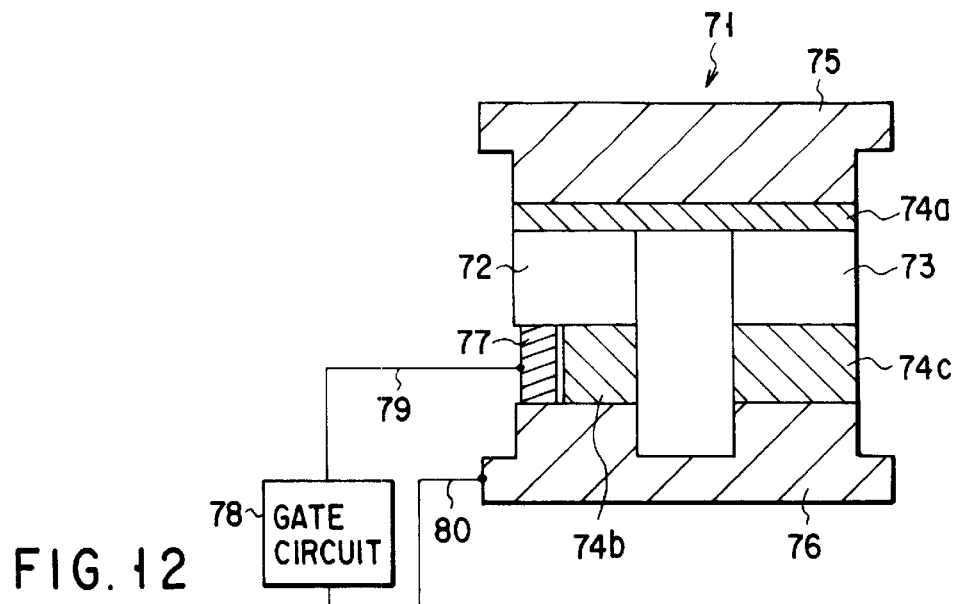
FIG. 12 is a sectional view showing the structure of a power semiconductor device according to the fifth embodiment of the present invention.

FIG. 12 is a sectional view showing the arrangement of the voltage-driven power semiconductor device according to the fifth embodiment of the present invention. A voltage-driven power semiconductor device 71 has the following arrangement.

As shown in FIG. 12, an IEGT chip 72 and an FWD chip 73 are press-contacted from the top by a collector (anode) press-contacting electrode plate 75 via a molybdenum plate 74a and from the bottom by an emitter (cathode) press-contacting electrode plate 76 via molybdenum plates 74b and 74c.

A spiral gate pin 77 is arranged between the IEGT chip 72 and the emitter press-contacting electrode plate 76. The spiral gate pin 77 is connected by a gate line 79 to a gate circuit 78 for driving the IEGT chip 72. The gate circuit 78 is connected to the emitter press-contacting electrode plate 76 by an emitter line 80.

The spiral gate pin 77 used has the same structure as that of the spiral emitter pin 64, FIG. 10B, used in the fourth embodiment. That is, the spiral gate pin 77 is obtained by spirally winding a plate-like member, and is elastic in a spiral direction. The plate-like member is prepared by covering a conductor with an insulator.

A core having a predetermined permeability is inserted in the center of the spiral formed by the spiral gate pin 77. By selecting the permeability of this core, the spiral gate pin 77 can be given a desired inductance component.

That portion of the spiral gate pin 77 which is in contact with the gate of the IEGT chip 72 is not covered with the insulator and is electrically connected to the gate.

Figure 13:
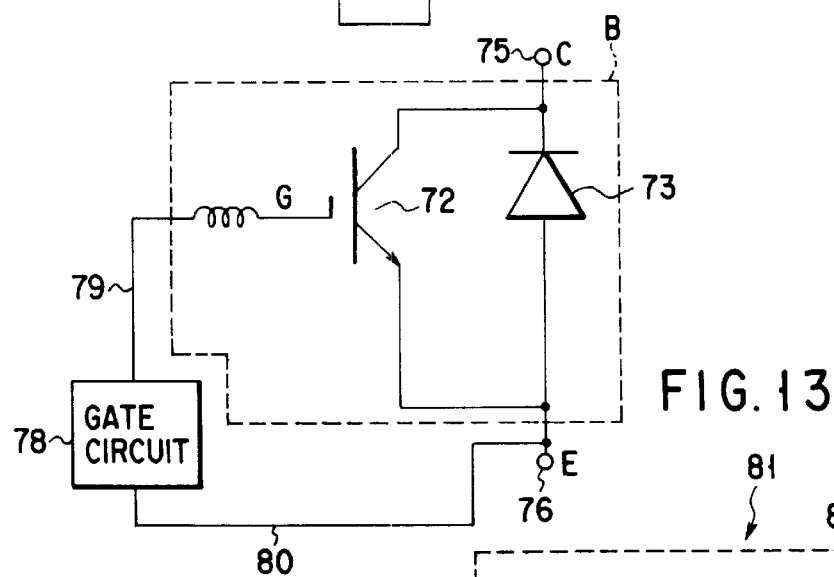
FIG. 13 is a circuit diagram showing the electrical arrangement of the power semiconductor device according to the fifth embodiment.

FIG. 13 is a circuit diagram showing the electrical arrangement of the voltage-driven power semiconductor device according to the fifth embodiment.

The collector press-contacting electrode plate 75 is connected to the collector of the IEGT chip 72 and the cathode of the FWD chip 73. The emitter press-contacting electrode plate 76 is connected to the emitter of the IEGT chip 72 and the anode of the FWD chip 73.

The gate circuit 78 is connected by the gate line 79 to the spiral gate pin 77, which is connected to the gate of the IEGT chip 72. The emitter line 80 connected to the gate circuit 78 is connected to the emitter press-contacting electrode plate 76.

In the voltage-driven power semiconductor device having the arrangement shown in FIGS. 12 and 13, oscillation of the gate voltage can be prevented by connecting the spiral gate pin 77 to the gate line side of the gate circuit.

According to the fifth embodiment, oscillation of the gate voltage can be prevented by connecting the spiral gate pin 77 to the gate line side of the gate circuit. Therefore, a steep current change (di/dt) upon an OFF operation can be suppressed, and a steep voltage change (dv/dt) caused by the current change (di/dt) can also be suppressed. The IEGT chip 72 can therefore be prevented from destruction.

Moreover, the spiral gate pin 77 can be given a desired inductance component by replacing the core inserted in the center of the spiral formed by the spiral gate pin 77, and changing the permeability of the core.

A voltage-driven power semiconductor device according to the sixth embodiment of the present invention will be described below. Similar to the first embodiment, this voltage-driven power semiconductor device is a press IEGT package constituted by press-contacting a plurality of IEGT chips and a plurality of FWD chips by a pair of press-contacting electrode plates. The IEGT chips are power semiconductor elements. The FWD chips are parallel-connected to the IEGT chips in a reverse energization direction. In the sixth embodiment, the voltage-driven power semiconductor device will be explained with reference to a sectional view of a press IEGT package constituted by one IEGT chip and one FWD chip.

Figure 14:
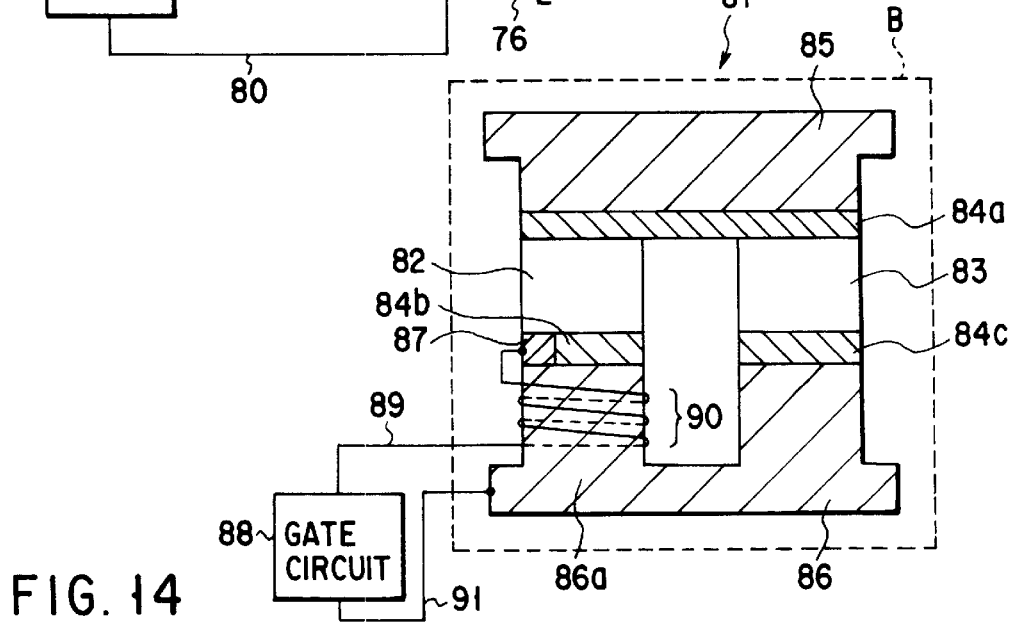
FIG. 14 is a sectional view showing the structure of a power semiconductor device according to the sixth embodiment of the present invention.

FIG. 14 is a sectional view showing the arrangement of the voltage-driven power semiconductor device according to the sixth embodiment of the present invention. A voltage-driven power semiconductor device 81 has the following arrangement.

As shown in FIG. 14, an IEGT chip 82 and an FWD chip 83 are press-contacted from the top by a collector (anode) press-contacting electrode plate 85 via a molybdenum plate 84a and from the bottom by an emitter (cathode) press-contacting electrode plate 86 via molybdenum plates 84b and 84c.

The gate of the IEGT chip 82 is connected to a gate pin 87. The gate pin 87 is connected by a gate line 89 to a gate circuit 88 for driving the IEGT chip 82. The gate line 89 is coiled around an electrode post 86a of the emitter press-contacting electrode plate 86, as shown in FIG. 14. The gate line 89 forms a winding wire 90. The gate circuit 88 is connected to the emitter press-contacting electrode plate 86 by an emitter line 91.

Figure 15:
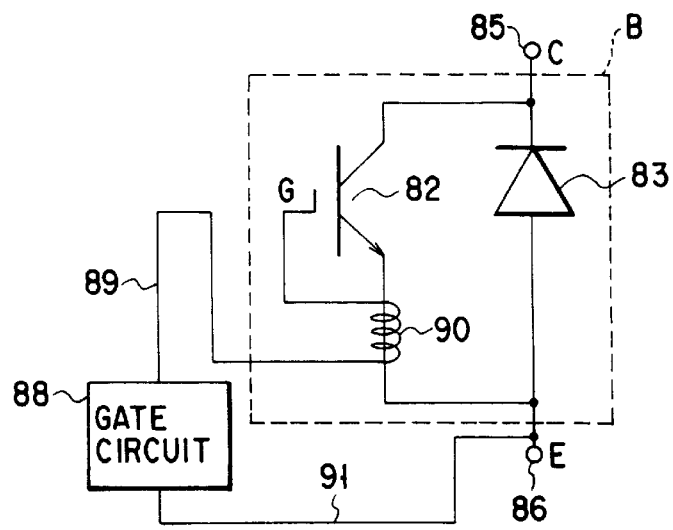
FIG. 15 is a circuit diagram showing the electrical arrangement of the power semiconductor device according to the sixth embodiment.

FIG. 15 is a circuit diagram showing the electrical arrangement of the voltage-driven power semiconductor device according to the sixth embodiment.

As shown in FIG. 15, the collector press-contacting electrode plate 85 is connected to the collector of the IEGT chip 82 and the cathode of the FWD chip 83. The emitter press-contacting electrode plate 86 is connected to the emitter of the IEGT chip 82 and the anode of the FWD chip 83.

The gate line 89 connecting the gate of the IEGT chip 82 and the gate circuit 88 has the winding wire 90. The gate circuit 88 is connected to the emitter press-contacting electrode plate 86 by the emitter line 91.

In the voltage-driven power semiconductor device having the arrangement shown in FIGS. 14 and 15, the gate line 89 connected to the gate of the IEGT chip 82 is coiled around the electrode post 86*a* on the emitter side of the IEGT chip to form the winding wire 90. Accordingly, a steep current change (di/dt) in the electrode post 86*a* upon an OFF operation generates an electromotive force in a direction in which the current flowing through the electrode post 86*a* is blocked. This electromotive force generates, on the winding wire 90, an induced electromotive force which reversely biases the voltage applied to the gate of the IEGT chip 82.

More specifically, the steep current change (di/dt) upon turning off the IEGT chip 82 generates an electromotive force in a direction in which the current flowing through the electrode post 86*a* is blocked. An induced electromotive force, which is generated on the gate line 89 by this electromotive force, reversely biases the gate voltage.

According to the sixth embodiment, by coiling the gate line 89 around the electrode post 86*a* connected to the emitter of the IEGT chip 82, an electromotive force is generated in a direction in which the current flowing through the electrode post 86*a* is blocked upon the steep current change (di/dt) after turning off the IEGT chip 82. This electromotive force generates an induced electromotive force on the gate line 89. The induced electromotive force reversely biases the gate voltage. This induced electromotive force can suppress the steep current change (di/dt) upon an OFF operation, and can also suppress a steep voltage change (dv/dt) caused by the current change (di/dt). As a result, the IEGT chip 82 can be prevented from destruction.

Figure 16:
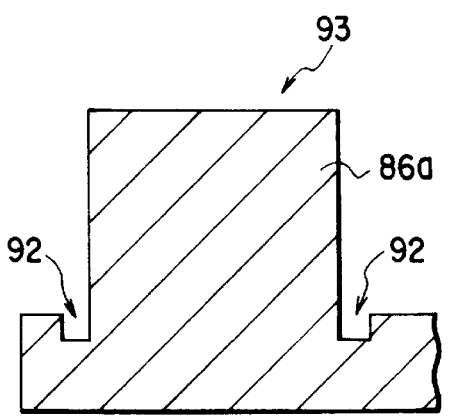
FIG. 16 is a sectional view showing the shape of an electrode post as a modification of the sixth embodiment.

As a modification of the sixth embodiment, the electrode post 86*a* may have grooves 92 for burying the gate line 89 in the bottom of the electrode post, as shown in FIG. 16. The use of an electrode post 93 having this shape facilitates winding of the gate line 89, and can prevent deformation of the would shape of the gate line 89 and changes in inductance component along with this deformation during the use of the power semiconductor device.

Figure 17:
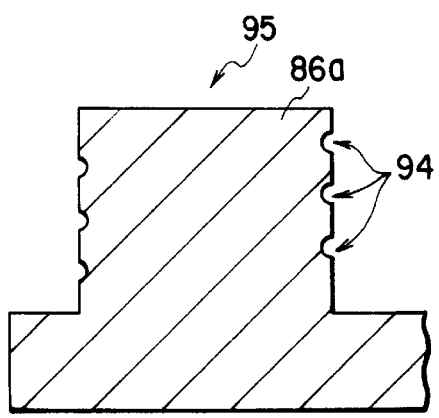
FIG. 17 is a sectional view showing the shape of an electrode post as another modification of the sixth embodiment.

As another modification of the sixth embodiment, the electrode post 86*a* may have grooves 94 for burying the gate line 89 in the side surface of the electrode post, as shown in FIG. 17. The use of an electrode post 95 having this shape facilitates winding of the gate line 89, and can prevent deformation of the wound shape of the gate line and changes in inductance component along with this deformation during the use of the power semiconductor device.

A voltage-driven power semiconductor device according to the seventh embodiment of the present invention will be described below. Similar to the first embodiment, this voltage-driven power semiconductor device is a press IEGT package constituted by press-contacting a plurality of IEGT chips and a plurality of FWD chips by a pair of press-contacting electrode plates. The IEGT chips are power semiconductor elements. The FWD chips are parallel-connected to the IEGT chips in a reverse energization direction. In the seventh embodiment, the voltage-driven power semiconductor device will be explained with reference to a sectional view of a press IEGT package constituted by one IEGT chip and one FWD chip.

Figure 18:
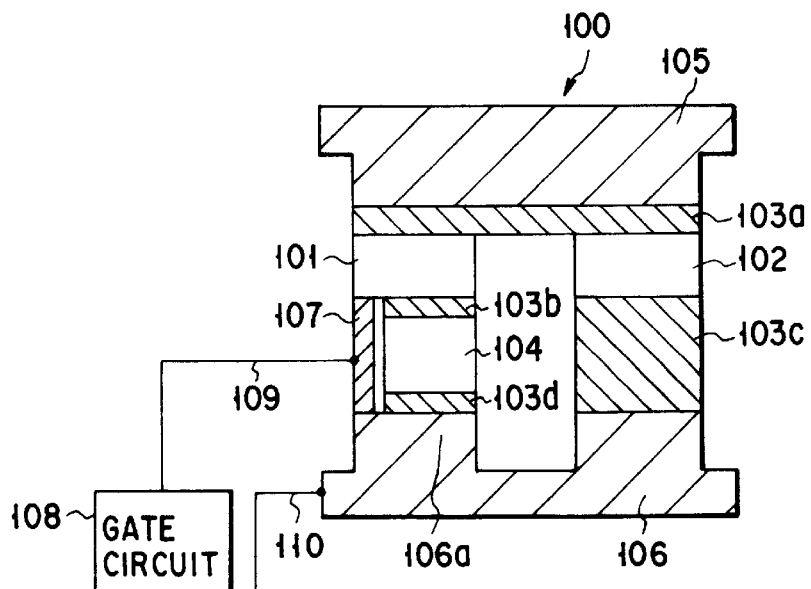
FIG. 18 is a sectional view showing the structure of a power semiconductor device according to the seventh embodiment of the present invention.

FIG. 18 is a sectional view showing the arrangement of the voltage-driven power semiconductor device according to the seventh embodiment of the present invention. A voltage-driven power semiconductor device 100 has the following arrangement.

As shown in FIG. 18, a molybdenum plate 103*a* is arranged on an IEGT chip 101 and an FWD chip 102. A molybdenum plate 103*b* is arranged below the IEGT chip 101, whereas a molybdenum plate 103*c* is arranged below the FWD chip 102. An inductance material 104 having an inductance component of 100 nH or less and a molybdenum plate 103*d* are arranged below the molybdenum plate 103*b*.

The IEGT chip 101 and the FWD chip 102 are press-contacted from the top by a collector (anode) press-contacting electrode plate 105 via a molybdenum plate 103*a* and from the bottom by an emitter (cathode) press-contacting electrode plate 106 via the molybdenum plate 103*d*, the inductance material 104, and the molybdenum plates 103*b* and 103*c*.

The gate of the IEGT chip 101 is connected to a gate pin 107. The gate pin 107 is connected by a gate line 109 to a gate circuit 108 for driving the IEGT chip 101. The gate circuit 108 is connected to the emitter press-contacting electrode plate 106 by an emitter line 110.

The inductance material 104 will be exemplified.

Figure 19:
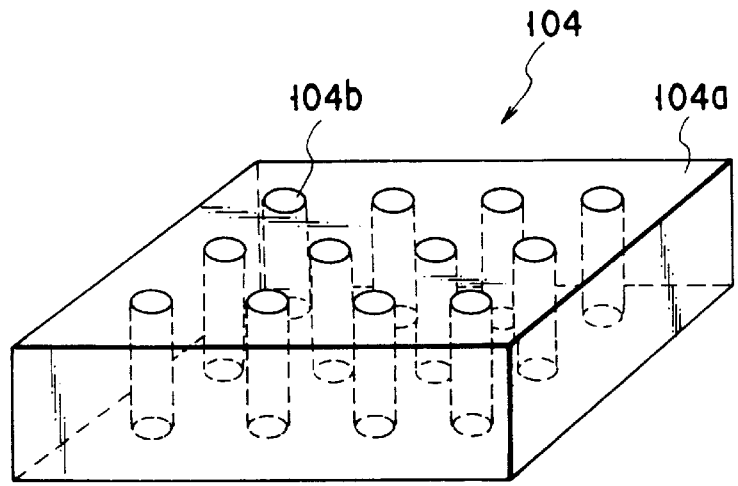
FIG. 19 is a perspective view showing an example of a structure forming an inductance material.

FIG. 19 is a perspective view showing an example of a structure forming the inductance material 104. The inductance material shown in FIG. 19 is prepared by extending a material 104*b* having a high conductivity, such as an aluminum (Al) wire, through part of a material 104*a*, such as SiC or air (space), having a thermal expansion coefficient almost equal to that of silicon (Si) and a conductivity lower than a metal.

Figure 20:
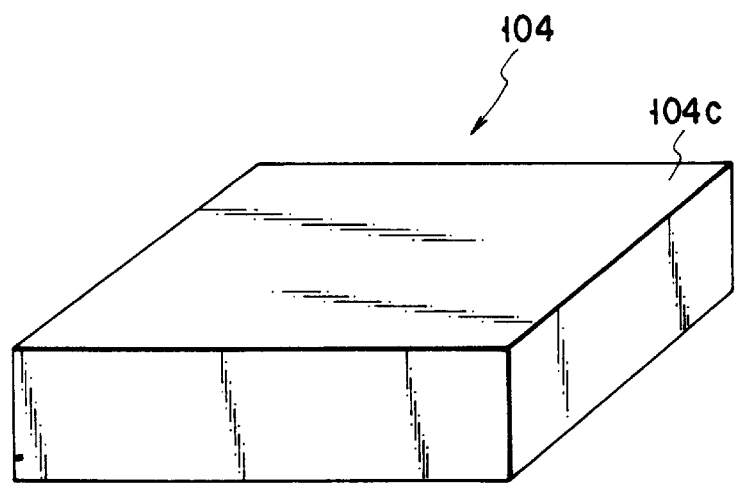
FIG. 20 is a perspective view showing another example of the structure forming the inductance material.

FIG. 20 is a perspective view showing another example of the structure forming the inductance material 104. The inductance material shown in FIG. 20 is a composite material 104*c* consisting of a material, such as SiC, having a thermal expansion coefficient almost equal to that of Si and a conductivity lower than a metal, and a material having a high conductivity such as Al. The inductance material 104 can give a desired inductance component by changing the arrangement pitch of the Al wire or the Al content.

According to the seventh embodiment, an induced electromotive force generated in the inductance material 104 arranged between the emitter of the IEGT chip 101 and the emitter press-contacting electrode plate 106 can suppress a steep current change (di/dt) upon an OFF operation, and can further suppress a steep voltage change (dv/dt) caused by the current change (di/dt). Therefore, the IEGT chip 101 can be prevented from destruction.

Figure 21:
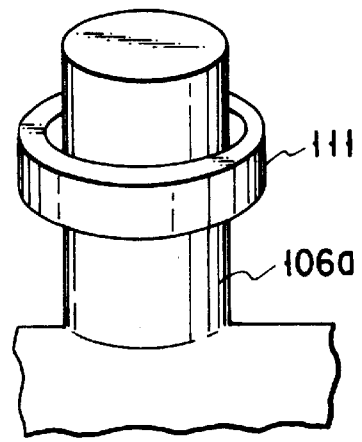
FIG. 21 is a perspective view showing an example of an electrode post surrounded by a magnetic substance.

Note that a molybdenum plate may replace the inductance material 104 between the emitter of the inductance material 101 and the emitter press-contacting electrode plate 106. As shown in FIG. 21, a magnetic substance 111 such as a ferrite bead may be arranged around an electrode post 106*a*. With this arrangement, the steep current change (di/dt) upon turning off the IEGT chip and the steep voltage change (dv/dt) caused by the current change (di/dt) can be suppressed. The IEGT chip 101 can be prevented from destruction.

A voltage-driven power semiconductor device according to the eighth embodiment of the present invention will be described below. The eighth embodiment is a modification of the first embodiment. This voltage-driven power semiconductor device is a press IEGT package constituted by press-contacting a plurality of IEGT chips and a plurality of FWD chips by a pair of press-contacting electrode plates. The IEGT chips are power semiconductor elements. The FWD chips are parallel-connected to the IEGT chips in a reverse energization direction. In the eighth embodiment, the voltage-driven power semiconductor device will be explained with reference to a sectional view of one IEGT chip and an inductance formed between the IEGT chip and an emitter press-contacting electrode plate.

Figure 22A:
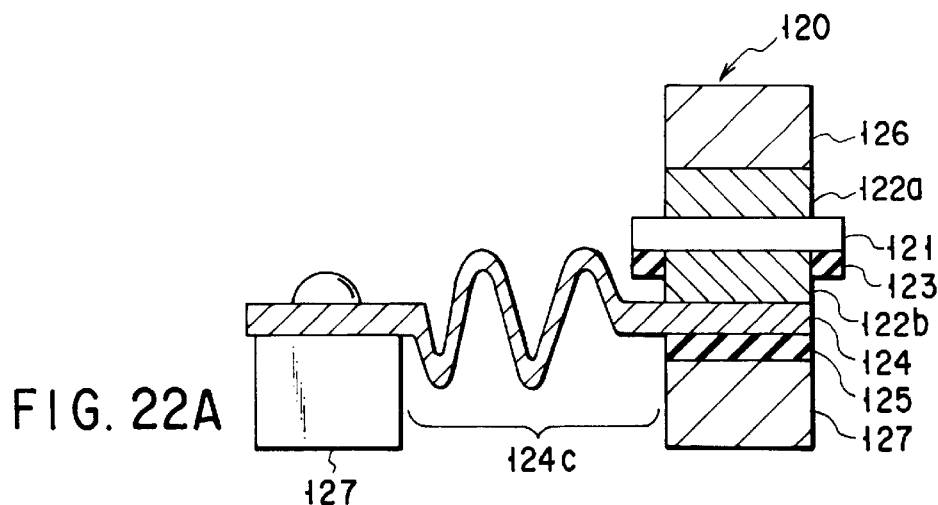
FIG. 22A is a sectional view of a portion press-contacting an IEGT chip in a voltage-driven power semiconductor device according to the eighth embodiment of the present invention.

FIG. 22A is a sectional view of a portion press-contacting the IEGT chip in the voltage-driven power semiconductor device according to the eighth embodiment of the present invention. A voltage-driven power semiconductor device 120 has the following arrangement.

As shown in FIG. 22A, a molybdenum plate 122a is arranged on an IEGT chip 121, while a molybdenum plate 122b and a positioning insulator 123 are arranged below the IEGT chip 121.

Figure 22B:
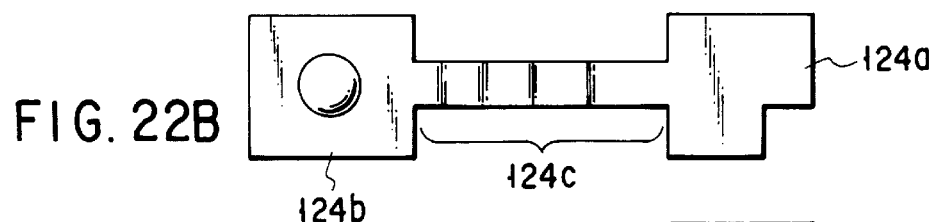
FIG. 22B is a plan view of a thin copper plate 124 in FIG. 22A.

A thin copper plate 124 made of copper is arranged below the molybdenum plate 122b. FIG. 22B is a plan view of the thin copper plate 124. As shown in FIG. 22B, the thin copper plate 124 is made up of a press portion 124a press-contacting the IEGT chip 121, a portion 124b connected to an emitter press-contacting electrode plate 127, and a wavy portion 124c between the press portion 124a and the connected portion 124b. The wavy portion 124c is thinner than the press portion 124a and the connected portion 124b, and has a wavy shape. The wavy portion 124c has an inductance component, which is set to 100 nH or less in this embodiment. A thin insulating plate 125 having insulating properties is arranged below the thin copper plate 124.

The IEGT chip 121 is press-contacted from the top by a collector (anode) press-contacting electrode plate 126 via the molybdenum plate 122a and from the bottom by an emitter (cathode) press-contacting electrode plate 127 via the molybdenum plate 122b, the thin copper plate 124, and the insulator 125.

Figure 22C:
FIG. 22C is a plan view of a molybdenum plate 122a or 122b in FIG. 22A.

FIG. 22C is a plan view of the molybdenum plate 122a or 122b. The remaining arrangement is the same as that in the first embodiment, and a description thereof will be omitted.

In the voltage-driven power semiconductor device having the arrangement shown in FIG. 22A, a steep current change (di/dt) upon turning off the IEGT chip 121 generates an induced electromotive force at the wavy portion 124c of the thin copper plate 124 in a direction in which the current flowing through the wavy portion 124c is blocked. This induced electromotive force reversely biases the voltage applied to the gate of the IEGT chip 121.

According to the eighth embodiment, the induced electromotive force generated at the wavy portion 124c of the thin copper plate 124 having an inductance component between the emitter of the IEGT chip 121 and the emitter press-contacting electrode plate 127 can suppress the steep current change (di/dt) upon an OFF operation, and can further suppress a steep voltage change (dv/dt) caused by the current change (di/dt). Consequently, the IEGT chip 121 can be prevented from destruction.

A voltage-driven power semiconductor device according to the ninth embodiment of the present invention will be described below. The ninth embodiment is a modification of the third embodiment. Similar to the third embodiment, this voltage-driven power semiconductor device is a press IEGT package constituted by press-contacting a plurality of IEGT chips and a plurality of FWD chips by a pair of press-contacting electrode plates. The IEGT chips are power semiconductor elements. The FWD chips are parallel-connected to the IEGT chips in a reverse energization direction.

Figure 23:
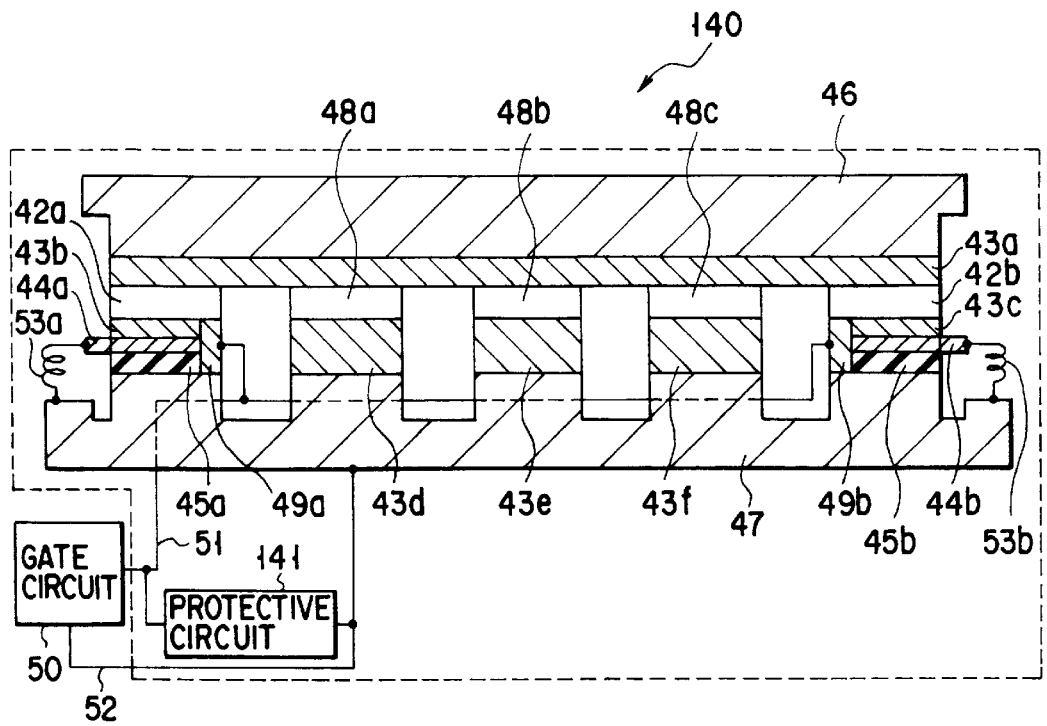
FIG. 23 is a sectional view showing the structure of a power semiconductor device according to the ninth embodiment of the present invention.

FIG. 23 is a sectional view showing the arrangement of the voltage-driven power semiconductor device according to the ninth embodiment of the present invention. A voltage-driven power semiconductor device 140 has the following arrangement.

As shown in FIG. 23, IEGT chips 42a and 42b are press-contacted from the top by a collector (anode) press-contacting electrode plate 46 via a molybdenum plate 43a and from the bottom by an emitter (cathode) press-contacting electrode plate 47 via molybdenum plates 43b and 43c, thin copper plates 44a and 44b, and thin insulating plates 45a and 45b. Similarly, FWD chips 48a, 48b, and 48c are press-contacted from the top by the collector press-contacting electrode plate 46 via the molybdenum plate 43a and from the bottom by the emitter press-contacting electrode plate 47 via molybdenum plates 43d, 43e, and 43f.

The gates of the IEGT chips 42a and 42b are respectively connected to gate pins 49a and 49b. The gate pins 49a and 49b are connected by a gate line 51 to a gate circuit 50 for driving the IEGT chips 42a and 42b. The gate circuit 50 is connected to the emitter press-contacting electrode plate 47 by an emitter line 52. A protective circuit 141 functioning to protect the IEGT package is connected between the gate line 51 and the emitter line 52.

Inductances 53a and 53b each having an inductance component of 100 nH or less are respectively arranged between the thin copper plates 44a and 44b connected to the emitters of the IEGT chips 42a and 42b and the emitter press-contacting electrode plate 47.

Figure 24:
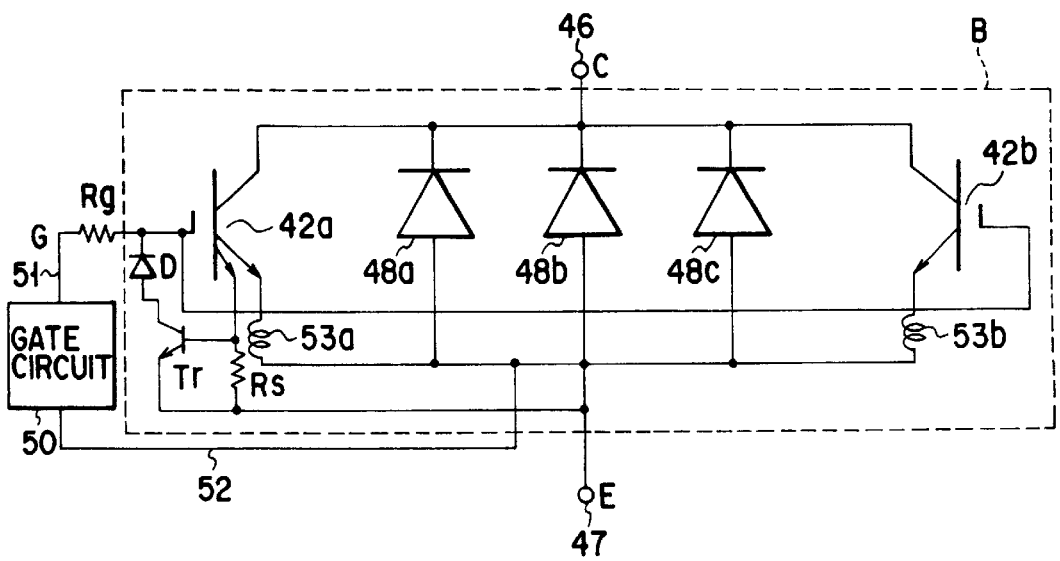
FIG. 24 is a circuit diagram showing the electrical arrangement of the power semiconductor device according to the ninth embodiment.

FIG. 24 is a circuit diagram showing the electrical arrangement of the voltage-driven power semiconductor device according to the ninth embodiment.

This power semiconductor device comprises IEGT chip 42a with a current sense function. The IEGT chip 42a comprises a sense-side emitter.

As shown in FIG. 24, the collector press-contacting electrode plate 46 is connected to the collectors of the IEGT chips 42a and 42b and the cathodes of the FWD chips 48a, 48b, and 48c. The emitter press-contacting electrode plate 47 is connected to the inductances 53a and 53b respectively connected to the emitters of the IEGT chips 42a and 42b, and the anodes of the FWD chips 48a, 48b, and 48c.

The gate line 51 connected to the gate circuit 50 is connected to the gates of the IEGT chips 42a and 42b via a gate resistor Rg. The gate circuit 50 is connected to the emitter press-contacting electrode plate 47 by the emitter line 52.

The sense-side emitter of the IEGT chip 42a is connected to the gate of a transistor Tr and one terminal of a resistor Rs. The collector of the transistor Tr is connected between the gate of the IEGT chip 42a and the gate resistor Rg via a diode D. The emitter of the transistor Tr and the other terminal of the resistor Rs are connected to the emitter press-contacting electrode plate 47.

In the voltage-driven power semiconductor device having the arrangement shown in FIGS. 23 and 24, a steep current change (di/dt) upon turning off the IEGT chips 42a and 42b generates an induced electromotive force in the inductances 53a and 53b in a direction in which the current flowing through the inductances 53a and 53b is blocked. This induced electromotive force reversely biases the voltage applied to the gates of the IEGT chips 42a and 42b.

When a large current (excessive current) flows into the IEGT chip 42a, the protective circuit 141 clamps this large current to a predetermined current value. When the IEGT chips 42a and 42b are destructed, the protective circuit 141 releases the current flowing into the IEGT chip 42a.

According to the ninth embodiment, the induced electromotive force generated in the inductances 53a and 53b arranged between the emitters of the IEGT chips 42a and 42b and the emitter press-contacting electrode plate 47 can suppress the steep current change (di/dt) upon an OFF operation, and can further suppress a steep voltage change (dv/dt) caused by the current change (di/dt). Therefore, the IEGT chips 42a and 42b can be prevented from destruction. Even if a larger current flows into the IEGT chip, the protective circuit can prevent the IEGT chips 42a and 42b from being destructed by the current.

The outer peripheral portion of the voltage-driven power semiconductor device according to the first to ninth embodiments and the 12th to 15th embodiments (to be described later) will be described.

Figure 25:
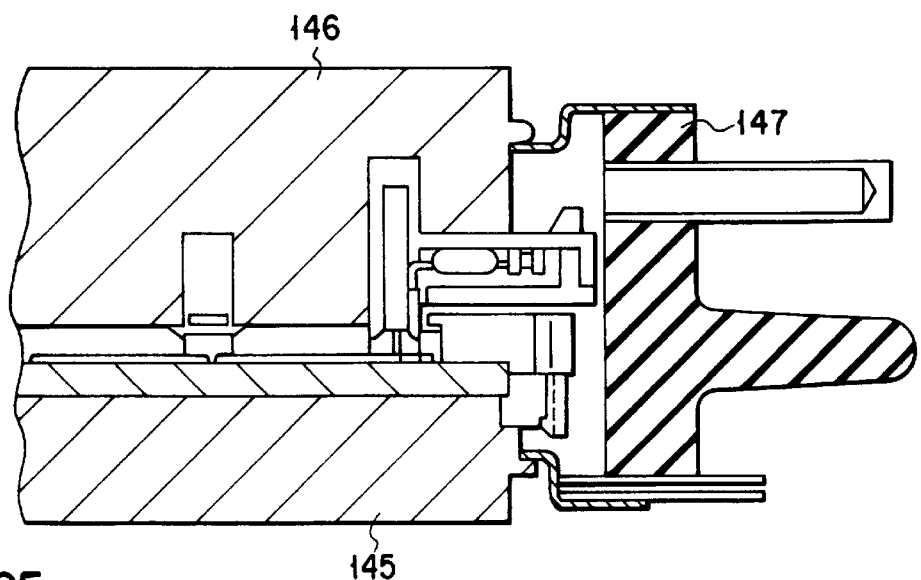
FIG. 25 is a sectional view showing the structure of the outer peripheral portion of the power semiconductor device according to the first to ninth embodiments.

FIG. 25 is a sectional view showing the structure of the outer peripheral portion of the power semiconductor device according to the first to ninth embodiments and the 12th to 15th embodiments. This power semiconductor device comprises a pair of press-contacting electrode plates exposed on the upper and lower surfaces of an IEGT chip in correspondence with the collector and emitter, i.e., collector and emitter press-contacting electrode plates 145 and 146, and a ceramic outer insulating cylinder 147 which is arranged between the collector and emitter press-contacting electrode plates 145 and 146 and seal-joined to them. The collector and emitter press-contacting electrode plates 145 and 146 and the outer insulating cylinder 147 form an airtight package.

An example of an application of the present invention to a module IEGT package instead of the press IEGT package will be explained as the 10th and 11th embodiments.

A voltage-driven power semiconductor device according to the 10th embodiment of the present invention is a module IEGT package assembled by connecting a plurality of IEGT chips and a plurality of FWD chips with bonding wires. The IEGT chips are power semiconductor elements. The FWD chips are parallel-connected to the IEGT chips in a reverse energization direction. In the 10th embodiment, a module IEGT package constituted by one IEGT chip and one FWD chip will be exemplified.

Figure 26:
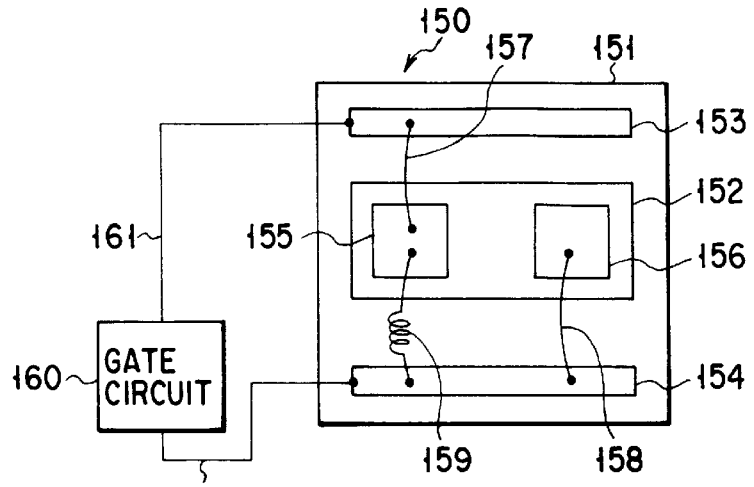
FIG. 26 is a view showing the structure of the main part of a power semiconductor device according to the 10th embodiment of the present invention.

FIG. 26 is a view showing the arrangement of the voltage-driven power semiconductor device according to the 10th embodiment of the present invention. A voltage-driven power semiconductor device 150 has the following arrangement.

As shown in FIG. 26, a copper collector electrode 152, a copper gate electrode 153, and a copper emitter electrode 154 are adhered to an insulating substrate (DBC) 151. On the collector electrode 152, an IEGT chip 155 and an FWD chip 156 are soldered.

An aluminum (Al) bonding wire 157 is formed between the IEGT chip 155 and the gate electrode 153 to connect them. Similarly, an Al bonding wire 158 is formed between the FWD chip 156 and the emitter electrode 154 to connect them.

An inductance material 159 made of, e.g., a wire having a predetermined inductance component is arranged between the IEGT chip 155 and the emitter electrode 154 to connect them. As the bonding wire, an Al wire about 200 μm in diameter is used.

The gate electrode 153 is connected by a gate line 161 to a gate circuit 160 for driving the IEGT chip 155. The gate circuit 160 is connected to the emitter electrode 154 by an emitter line 162. The insulating substrate 151 having this structure is accommodated in a package. This package is provided with external terminals and used as a module IEGT package.

Figure 27:
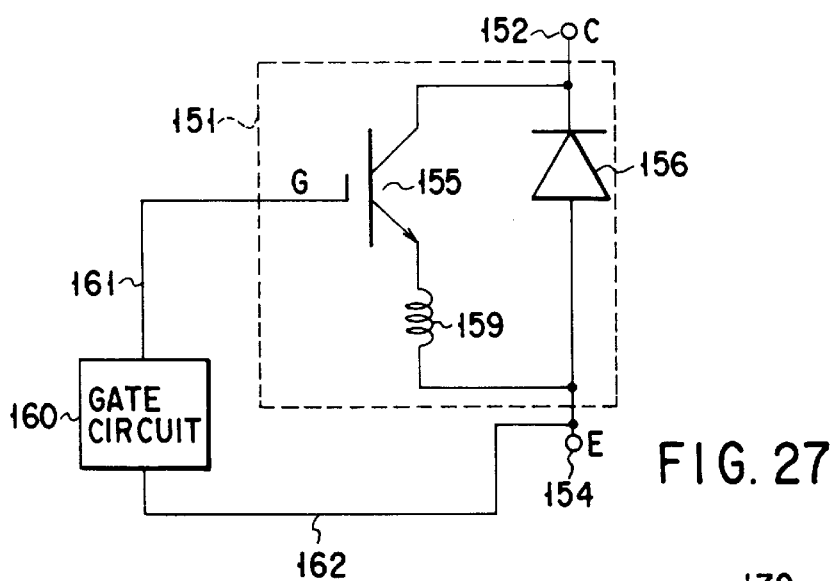
FIG. 27 is a circuit diagram showing the electrical arrangement of the power semiconductor device according to the 10th embodiment.

FIG. 27 is a circuit diagram showing the electrical arrangement of the voltage-driven power semiconductor device according to the 10th embodiment. The collector electrode 152 is connected to the collector of the IEGT chip 155 and the cathode of the FWD chip 156.

The emitter electrode 154 is connected to the inductance material 159 connected to the emitter of the IEGT chip 155, and the anode of the FWD chip 156. The gate circuit 160 is connected to the gate of the IEGT chip 155 by the gate line 161. The gate circuit 160 is further connected to the emitter electrode 154 by the emitter line 162.

In the voltage-driven power semiconductor device having the arrangement shown in FIGS. 26 and 27, a steep current change (di/dt) upon turning off the IEGT chip 155 generates an induced electromotive force in the inductance material 159 in a direction in which the current flowing through the inductance material 159 is blocked. This induced electromotive force reversely biases the voltage applied to the gate of the IEGT chip 155.

According to the 10th embodiment, the induced electromotive force generated in the inductance material 159 arranged between the emitter of the IEGT chip 155 and the emitter electrode 154 can suppress the steep current change (di/dt) upon an OFF operation, and can further suppress a steep voltage change (dv/dt) caused by the current change (di/dt). Accordingly, the IEGT chip 155 can be prevented from destruction.

A voltage-driven power semiconductor device according to a modification of the 10th embodiment will be described. Similar to the 10th embodiment, the power semiconductor device according to this modification is a module IEGT package prepared by connecting a plurality of IEGT chips and a plurality of FWD chips with bonding wires and arranging a bonding pad to easily set a desired inductance component. The IEGT chips are power semiconductor elements. The FWD chips are parallel-connected to the IEGT chips in a reverse energization direction. In this modification, a module IEGT package constituted by one IEGT chip and one FWD chip will be exemplified.

Figure 28:
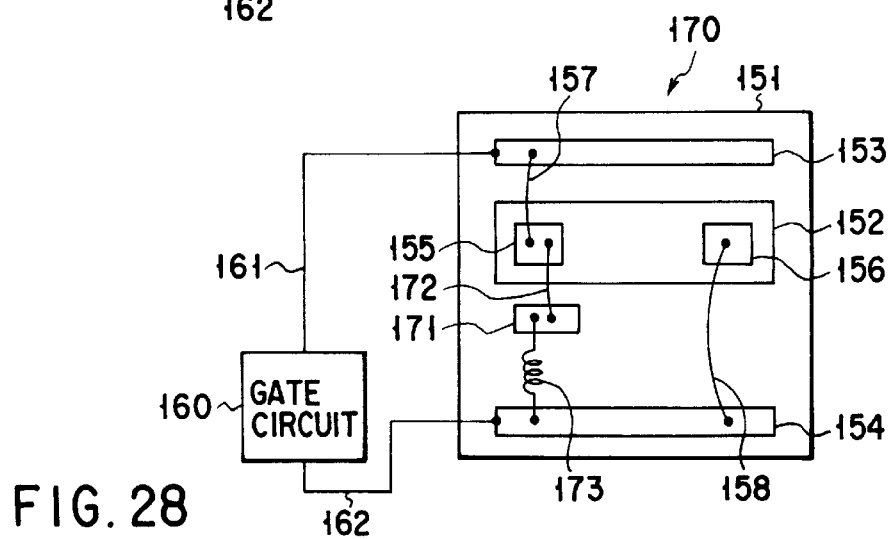
FIG. 28 is a view showing the structure of the power semiconductor device according to a modification of the 10th embodiment.

FIG. 28 is a view showing the arrangement of the voltage-driven power semiconductor device according to the modification of the 10th embodiment. A voltage-driven power semiconductor device 150 has the following arrangement.

As shown in FIG. 28, a copper collector electrode 152, a copper gate electrode 153, and a copper emitter electrode 154 are adhered to an insulating substrate (DBC) 151. On the collector electrode 152, an IEGT chip 155 and an FWD chip 156 are soldered.

An aluminum (Al) bonding wire 157 is formed between the IEGT chip 155 and the gate electrode 153 to connect them. Similarly, an Al bonding wire 158 is formed between the FWD chip 156 and the emitter electrode 154 to connect them. As the bonding wire, an Al wire about 200 μm in diameter is used.

A bonding pad 171 for joining the bonding wire is arranged on the insulating substrate (DBC) 151. An Al bonding wire 172 is formed between the bonding pad 171 and the IEGT chip 155 to connect them. An inductance material 173 made of, e.g., a wire having a predetermined inductance component is formed between the bonding pad 171 and the emitter electrode 154 to connect them.

The gate electrode 153 is connected by a gate line 161 to a gate circuit 160 for driving the IEGT chip 155. The gate circuit 160 is connected to the emitter electrode 154 by an emitter line 162. The insulating substrate 151 having this structure is accommodated in a package. This package is provided with external terminals and used as a module IEGT package.

The electrical arrangement of the power semiconductor device according to this modification is the same as that in the 10th embodiment shown in FIG. 27, and a description thereof will be omitted.

In the voltage-driven power semiconductor device having the arrangement shown in FIGS. 27 and 28, a steep current change (di/dt) upon turning off the IEGT chip 155 generates an induced electromotive force in the inductance material 173 in a direction in which the current flowing through the inductance material 173 is blocked. This induced electromotive force reversely biases the voltage applied to the gate of the IEGT chip 155.

According to the modification of the 10th embodiment, an induced electromotive force generated in the inductance material 173 arranged between the bonding pad 171 connected to the emitter of the IEGT chip 155, and the emitter electrode 154 can suppress a steep current change (di/dt) upon turning off the IEGT chip 155, and can further suppress a steep voltage change (dv/dt) caused by the current change (di/dt). As a result, the IEGT chip 155 can be prevented from destruction.

A voltage-driven power semiconductor device according to the 11th embodiment of the present invention will be described. Similar to the 10th embodiment, this voltage-driven power semiconductor device is a module IEGT package assembled by connecting a plurality of IEGT chips and a plurality of FWD chips with bonding wires. The IEGT chips are power semiconductor elements. The FWD chips are parallel-connected to the IEGT chips in a reverse energization direction. In the 11th embodiment, a module IEGT package constituted by one IEGT chip and one FWD chip will be exemplified.

Figure 29:
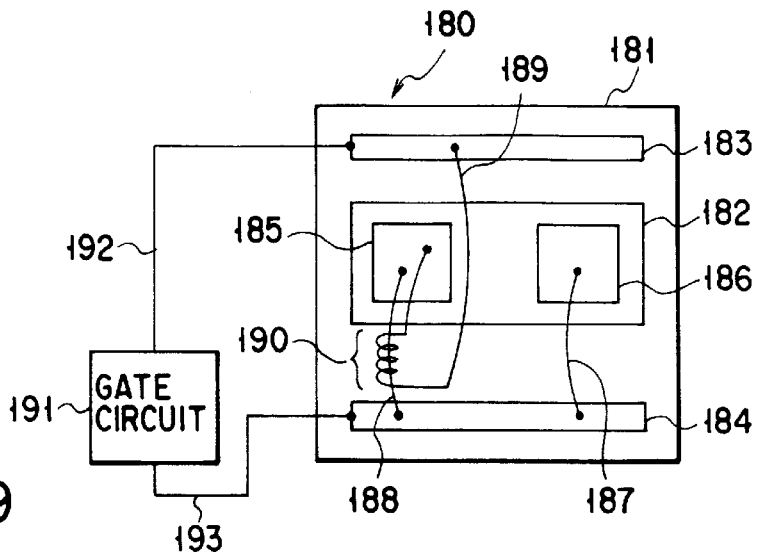
FIG. 29 is a view showing the structure of a power semiconductor device according to the 11th embodiment of the present invention.

FIG. 29 is a view showing the arrangement of the voltage-driven power semiconductor device according to the 11th embodiment of the present invention. A voltage-driven power semiconductor device 180 has the following arrangement.

As shown in FIG. 29, a copper collector electrode 182, a copper gate electrode 183, and a copper emitter electrode 184 are adhered to an insulating substrate (DBC) 181. On the collector electrode 182, an IEGT chip 185 and an FWD chip 186 are soldered.

An aluminum (Al) bonding wire 187 is formed between the FWD chip 186 and the emitter electrode 184 to connect them. Similarly, an Al bonding wire 188 is formed between the IEGT chip 185 and the emitter electrode 184 to connect them.

An Al bonding wire 189 is formed between the IEGT chip 185 and the gate electrode 183 to connect them. The bonding wire 189 is coiled around the bonding wire 188 to form a winding wire 190. On the winding wire 190, a predetermined inductance component is generated.

The gate electrode 183 is connected by a gate line 192 to a gate circuit 191 for driving the IEGT chip 185. The gate circuit 191 is connected to the emitter electrode 184 by an emitter line 193. The insulating substrate 181 having this structure is accommodated in a package. This package is provided with external terminals and used as a module IEGT package.

Figure 30:
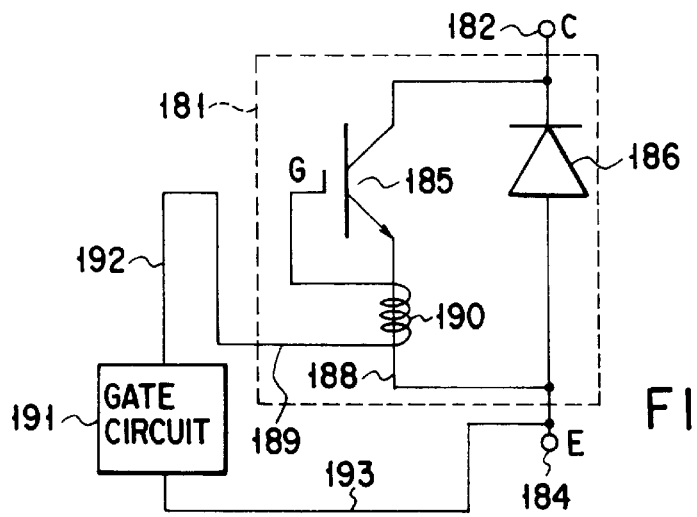
FIG. 30 is a circuit diagram showing the electrical arrangement of the power semiconductor device according to the 11th embodiment.

FIG. 30 is a circuit diagram showing the electrical arrangement of the voltage-driven power semiconductor device according to the 11th embodiment.

As shown in FIG. 30, the collector electrode 182 is connected to the collector of the IEGT chip 185 and the cathode of the FWD chip 186. The emitter electrode 184 is connected to the emitter of the IEGT chip 185 and the anode of the FWD chip 186.

The gate circuit 191 is connected to the gate of the IEGT chip 185 by the gate line 192 and the bonding wire 189. The bonding wire 189 has the winding wire 190. The gate circuit 191 is further connected to the emitter electrode 184 by the emitter line 193.

In the voltage-driven power semiconductor device having the arrangement shown in FIGS. 29 and 30, the winding wire 190 is formed by coiling the bonding wire 189 connected to the gate of the IEGT chip 185 around the bonding wire 188 connected to the emitter of the IEGT chip. With this structure, a steep current change (di/dt) upon an OFF operation generates an electromotive force in a direction in which the current flowing through the bonding wire 188 is blocked. This electromotive force generates, on the winding wire 190, an induced electromotive force which reversely biases the voltage applied to the gate of the IEGT chip 185.

More specifically, the steep current change (di/dt) upon turning off the IEGT chip 185 generates an electromotive force in a direction in which the current flowing through the bonding wire 188 is blocked. An induced electromotive force, which is generated on the gate line 189 by this electromotive force, reversely biases the gate voltage.

According to the 11th embodiment, by coiling the bonding wire 189 around the bonding wire 188 connected to the emitter of the IEGT chip 185, an electromotive force is generated in a direction in which the current flowing through the bonding wire 188 is blocked upon the steep current change (di/dt) after turning off the IEGT chip 185. This electromotive force generates an induced electromotive force on the bonding wire 189. The induced electromotive force reversely biases the gate voltage. Therefore, the induced electromotive force can suppress the steep current change (di/dt) upon an OFF operation, and can also suppress a steep voltage change (dv/dt) caused by the current change (di/dt). The IEGT chip 185 can be prevented from destruction.

A voltage-driven power semiconductor device according to the 12th embodiment of the present invention will be described. Similar to the first embodiment, this voltage-driven power semiconductor device is a press IEGT package constituted by press-contacting a plurality of IEGT chips and a plurality of FWD chips by a pair of press-contacting electrode plates. The IEGT chips are power semiconductor elements. The FWD chips are parallel-connected to the IEGT chips in a reverse energization direction. In the 12th embodiment, the voltage-driven power semiconductor device will be explained with reference to a sectional view of a press IEGT package constituted by one IEGT chip and one FWD chip.

Figure 31:
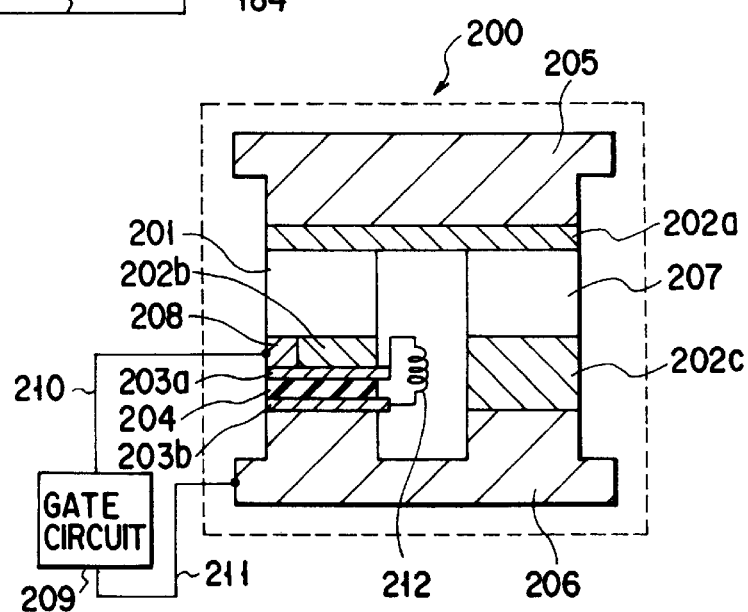
FIG. 31 is a view showing the structure of a power semiconductor device according to the 12th embodiment of the present invention.

FIG. 31 is a sectional view showing the arrangement of the voltage-driven power semiconductor device according to the 12th embodiment of the present invention. A voltage-driven power semiconductor device 200 has the following arrangement.

As shown in FIG. 31, an IEGT chip 201 is press-contacted from the top by a collector (anode) press-contacting electrode plate 205 via a molybdenum plate 202a and from the bottom by an emitter (cathode) press-contacting electrode plate 206 via a molybdenum plate 202b, a thin copper plate 203a, an insulator 204, and a thin copper plate 203b in the order named. An FWD chip 207 is press-contacted from the top by the collector press-contacting electrode plate 205 via the molybdenum plate 202a and from the bottom by the emitter press-contacting electrode plate 206 via a molybdenum plate 202c.

The gate of the IEGT chip 201 is connected to a gate pin 208. The gate pin 208 is connected by a gate line 210 to a gate circuit 209 for driving the IEGT chip 201. The gate circuit 209 is connected to the emitter press-contacting electrode plate 206 by an emitter line 211.

An inductance material 212 having an inductance component of 100 nH or less is arranged between the thin copper plate 203a connected to the emitter of the IEGT chip 201 and the thin copper plate 203b connected to the emitter press-contacting electrode plate 206.

Note that the thin copper plate 203a, the inductance material 212, and the thin copper plate 203b may be integrated. An example of the integrated member of the thin copper plate 203a, the inductance material 212, and the thin copper plate 203b will be explained.

FIG. 32A is a plan view of the integrated member of the thin copper plate 203a, the inductance material 212, and the thin copper plate 203b. FIG. 32B is a developed view of this member.

This member is formed of a copper plate about 100 μm thick, and shaped like an S with a size shown in FIG. 32B. The member is bent along the broken lines as fulcrums to have a shape shown in FIG. 32A, and is press-contacted from the top by the collector press-contacting electrode plate 205 and from the bottom by the emitter press-contacting electrode plate 206. The rectangular portion A in FIGS. 32A and 32B corresponds to the thin copper plate 203a, the rectangular portion B in FIGS. 32A and 32B corresponds to the thin copper plate 203b, and the portion C between the portions A and B corresponds to the inductance material 212.

The portions A, B, and C of the member have sizes shown in FIG. 32B. The size unit is "mm". The portion C has an inductance component of about 18 nH.

FIG. 33 is a perspective view of the member shown in FIG. 32A when viewed obliquely from above. The arrow in FIG. 33 indicates the flow of a current i.

FIG. 34 is a circuit diagram showing the electrical arrangement of the voltage-driven power semiconductor device according to the 12th embodiment. The circuit arrangement in the 12th embodiment is the same as that in the first embodiment. The collector press-contacting electrode plate 205 is connected to the collector of the IEGT chip 201 and the cathode of the FWD chip 207. The emitter press-contacting electrode plate 206 is connected to the inductance material 212 connected to the emitter of the IEGT chip 201, and the anode of the FWD chip 207. The gate circuit 209 is connected to the gate of the IEGT chip 201 by the gate line 210. The gate circuit 209 is also connected to the emitter press-contacting electrode plate 206 by the emitter line 211.

In the voltage-driven power semiconductor device having the arrangement shown in FIGS. 31 to 34, a steep current change (di/dt) upon turning off the IEGT chip 201 generates an induced electromotive force in the inductance material 212 in a direction in which the current flowing through the inductance material 212 is blocked. This induced electromotive force reversely biases the voltage applied to the gate of the IEGT chip 201.

According to the 12th embodiment, the induced electromotive force generated in the inductance material 212 arranged between the emitter of the IEGT chip 201 and the emitter press-contacting electrode plate 206 can suppress the steep current change (di/dt) upon an OFF operation, and can further suppress a steep voltage change (dv/dt) caused by the current change (di/dt). The IEGT chip 201 can therefore be prevented from destruction.

A voltage-driven power semiconductor device according to the 13th embodiment of the present invention will be described. The 13th embodiment is a modification of the ninth embodiment. This voltage-driven power semiconductor device is a press IEGT package which is constituted by press-contacting a plurality of IEGT chips and a plurality of FWD chips by a pair of press-contacting electrode plates, and incorporates a protective circuit. The IEGT chips are power semiconductor elements. The FWD chips are parallel-connected to the IEGT chips in a reverse energization direction.

Figure 35:
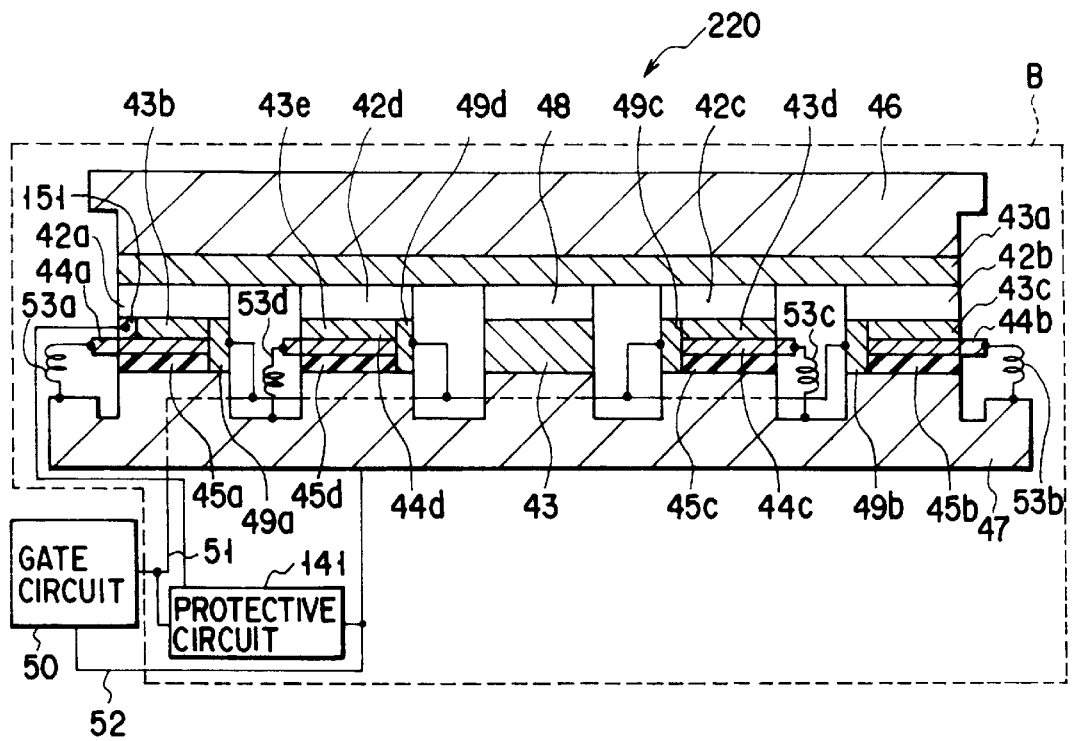
FIG. 35 is a sectional view showing the structure of a power semiconductor device according to the 13th embodiment of the present invention.

FIG. 35 is a sectional view showing the arrangement of the voltage-driven power semiconductor device according to the 13th embodiment of the present invention. A voltage-driven power semiconductor device 220 has the following arrangement.

As shown in FIG. 35, an IEGT chip 42a with a current sense function and IEGT chips 42b to 42d are press-contacted from the top by a collector (anode) press-contacting electrode plate 46 via a molybdenum plate 43a and from the bottom by an emitter (cathode) press-contacting electrode plate 47 via molybdenum plates 43b, 43c, 43d, and 43e, thin copper plates 44a, 44b, 44c, and 44d, and thin insulating plates 45a, 45b, 45c, and 45d. Similarly, an FWD chip 48 is press-contacted from the top by the collector press-contacting electrode plate 46 via the molybdenum plate 43a and from the bottom by the emitter press-contacting electrode plate 47 via a molybdenum plate 43.

The gates of the IEGT chips 42a, 42b, 42c, and 42d are respectively connected to gate pins 49a, 49b, 49c, and 49d. The gate pins 49a, 49b, 49c, and 49d are connected by a gate line 51 to a gate circuit 50 for driving the IEGT chips 42a, 42b, 42c, and 42d. The gate circuit 50 is connected to the emitter press-contacting electrode plate 47 by an emitter line 52. A protective circuit 141 functioning to protect the package is connected between the gate line 51 and the emitter line 52. The protective circuit 141 is connected to a current sense pin 151 connected to the IEGT chip 42a.

Inductances 53a, 53b, 53c, and 53d each having an inductance component of 100 nH or less are respectively arranged between the thin copper plates 44a, 44b, 44c, and 44d connected to the emitters of the IEGT chips 42a, 42b, 42c, and 42d, and the emitter press-contacting electrode plate 47.

Figure 36:
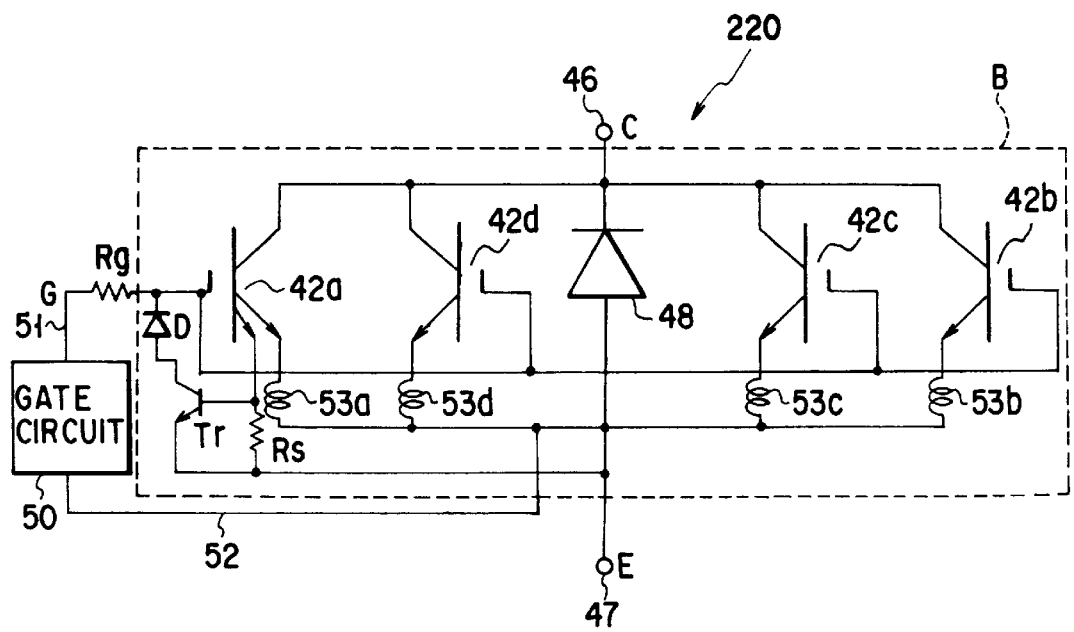
FIG. 36 is a circuit diagram showing the electrical arrangement of the power semiconductor device according to the 13th embodiment.

FIG. 36 is a circuit diagram showing the electrical arrangement of the voltage-driven power semiconductor device according to the 13th embodiment.

As shown in FIG. 36, the collector press-contacting electrode plate 46 is connected to the collectors of the IEGT chips 42a, 42b, 42c, and 42d and the cathode of the FWD chip 48. The emitter press-contacting electrode plate 47 is connected to the inductances 53a, 53b, 53c, and 53d respectively connected to the emitters of the IEGT chips 42a, 42b, 42c, and 42d, and the anode of the FWD chip 48.

The gate line 51 connected to the gate circuit 50 is connected to the gates of the IEGT chips 42a, 42b, 42c, and 42d via a gate resistor Rg. The gate circuit 50 is connected to the emitter press-contacting electrode plate 47 by the emitter line 52.

The sense-side emitter of the IEGT chip 42a is connected to the gate of a transistor Tr and one terminal of a resistor Rs. The collector of the transistor Tr is connected between the gate of the IEGT chip 42a and the gate resistor Rg via a diode D. The emitter of the transistor Tr and the other terminal of the resistor Rs are connected to the emitter press-contacting electrode plate 47.

In the voltage-driven power semiconductor device having the arrangement shown in FIGS. 35 and 36, a steep current change (di/dt) upon turning off the IEGT chips 42a, 42b, 42c, and 42d generates an induced electromotive force in the inductances 53a, 53b, 53c, and 53d in a direction in which the current flowing through the inductances 53a, 53b, 53c, and 53d is blocked. This induced electromotive force reversely biases the voltage applied to the gates of the IEGT chips 42a, 42b, 42c, and 42d.

This power semiconductor device comprises at least one IEGT chip 42a with a current sense function. Therefore, even when a large current flows into the IEGT chip 42a, the excessive current can be stably controlled by a sense signal output from the sense-side emitter (current sense terminal) of the IEGT chip 42a, and an RTC circuit operating in response to the sense signal. When the IEGT chips 42a, 42b, 42c, and 42d are destructed, the current flowing into the IEGT chip 42a is released to the reference potential.

According to the 13th embodiment, the induced electromotive force generated in the inductances 53a, 53b, 53c, and 53d arranged between the emitters of the IEGT chips 42a, 42b, 42c, and 42d and the emitter press-contacting electrode plate 47 can suppress the steep current change (di/dt) upon an OFF operation, and can further suppress a steep voltage change (dv/dt) caused by the current change (di/dt). Therefore, the IEGT chips 42a, 42b, 42c, and 42d can be prevented from destruction. Even if a larger current flows into the IEGT chip, the protective circuit can prevent the IEGT chips 42a, 42b, 42c, and 42d from being destructed by the current.

Giving at least one of IEGT chips a current sense function can abruptly improve the excessive current protective function of the power semiconductor device. Accordingly, when an excessive element current flows to cause, e.g., short-circuiting, the power semiconductor device having the IEGT chip as a power semiconductor element can be more reliably protected from the excessive current than a power semiconductor device having an IGBT chip.

More specifically, in the 13th embodiment, current oscillation between power semiconductor elements upon operation of the RTC circuit generates an induced electromotive force in the inductance in a current blocking direction. This electromotive force reversely biases the gate voltage. Further, a steep current change (di/dt) upon an OFF operation generates a similar induced electromotive force in the inductance. These induced electromotive forces can suppress current oscillation between elements immediately before an OFF operation, and can also suppress a steep current change (di/dt) upon generation of an excessive current. The semiconductor element with a current sense function and the RTC circuit can perform stable feedback.

A voltage-driven power semiconductor device according to the 14th embodiment of the present invention will be described.

Figure 37:
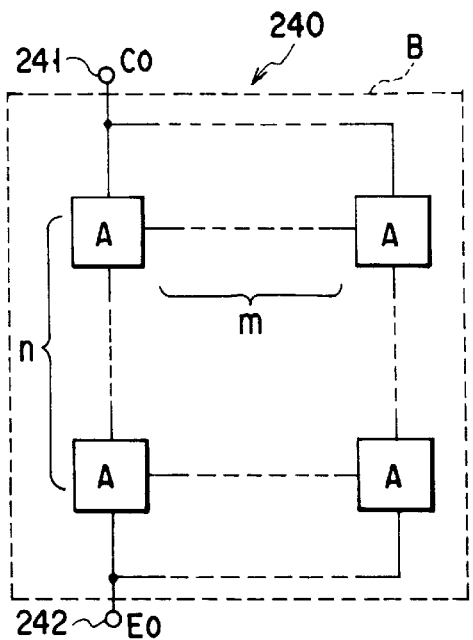
FIG. 37 is a circuit diagram showing the electrical arrangement of a power semiconductor device according to the 14th embodiment of the present invention.
Figure 38:
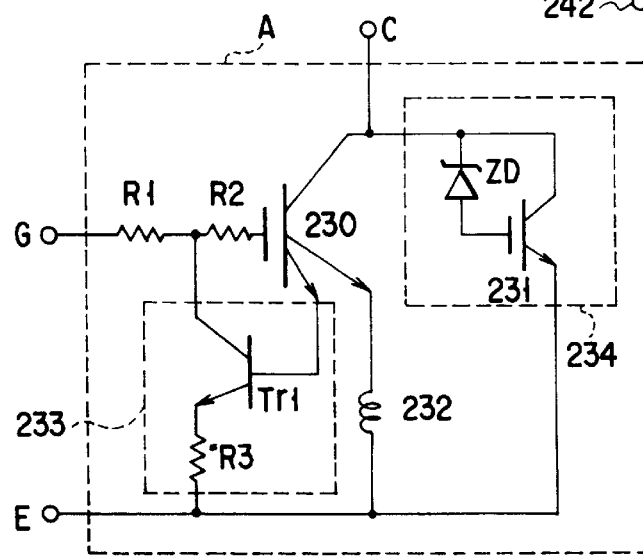
FIG. 38 is a circuit diagram of a semiconductor element circuit including a plurality of IEGT chips connected in the power semiconductor device of the 14th embodiment.

FIG. 37 is a circuit diagram showing the electrical arrangement of the voltage-driven power semiconductor device according to the 14th embodiment. FIG. 38 is a circuit diagram of a semiconductor element circuit including a plurality of IEGT chips connected in the power semiconductor device.

The power semiconductor device of the 14th embodiment is a press IEGT package obtained by series-connecting n semiconductor element circuits A, shown in FIG. 38, each including an IEGT chip with a current sense function, an RTC circuit, and an excessive voltage protective circuit, parallel-connecting m n-series-connected semiconductor element circuits A, and press-contacting these circuits A by a pair of press-contacting electrode plates. Note that n=1, 2, 3, . . . , and m=1, 2, 3, . . . The IEGT chip is a power semiconductor element with a current sense function.

The arrangement of the semiconductor element circuit A will be described.

As shown in FIG. 38, a collector terminal C is connected to the collector of an IEGT chip 230 with a current sense function, the cathode of a Zener diode ZD, and the collector of an IEGT chip 231. The anode of the Zener diode ZD is connected to the gate of the IEGT chip 231 whose emitter is connected to an emitter terminal E. The emitter of the IEGT chip 230 is connected to the emitter terminal E via an inductance 232, and its sense-side emitter is connected to the gate of a transistor Tr1.

The gate of the IEGT chip 230 is connected to a gate terminal G via resistors R1 and R2. The collector of the transistor Tr1 is connected to the connection point between the resistors R1 and R2, and its emitter is connected to the emitter terminal E via a resistor R3. As shown in FIG. 38, the transistor Tr1 and the resistor R3 constitute an RTC circuit 233, while the Zener diode ZD and the IEGT chip 231 constitute an excessive voltage protective circuit 234.

The voltage-driven power semiconductor device of the 14th embodiment shown in FIG. 37 will be described. A voltage-driven power semiconductor device 240 has the following arrangement.

As shown in FIG. 37, n semiconductor element circuits A are series-connected, and m n-series-connected semiconductor element circuits A are parallel-connected. The collector terminal of each semiconductor element circuit A arranged at an upper portion in FIG. 37 is connected to a collector press-contacting electrode plate 241, and the emitter terminal of each semiconductor element circuit A arranged at a lower portion is connected to an emitter press-contacting electrode plate 242. The gate terminal of the semiconductor element circuit A is connected to a gate circuit (not shown).

In the voltage-driven power semiconductor device having the arrangement shown in FIG. 37, a steep current change (di/dt) upon turning off the IEGT chip 230 generates an induced electromotive force in the inductance 232 in a direction in which the current flowing through the inductance 232 is blocked. This induced electromotive force reversely biases the gate voltage.

Since at least one IEGT chip 230 with a current sense function is arranged, even when a large current flows into the IEGT chip 230, the excessive current can be stably controlled by a current sense signal and the RTC circuit 233. When the IEGT chip 230 is destructed, the current flowing into the IEGT chip 230 is released to the reference potential.

Further, this power semiconductor device comprises m×n semiconductor element circuits A and the excessive voltage protective circuit 234. This arrangement enables to distribute the current flowing through the IEGT chip and disperse the voltage. Therefore, the power semiconductor device can control a larger power.

Figure 39:
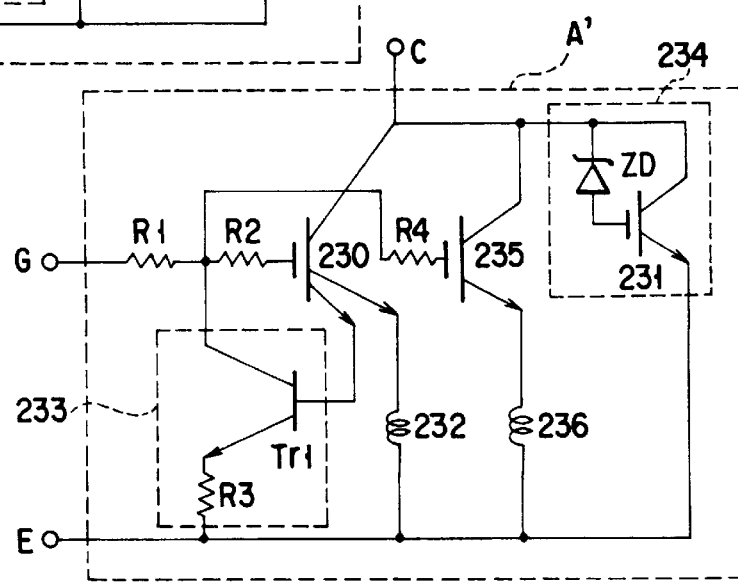
FIG. 39 is a circuit diagram of a modification of the semiconductor element circuit including a plurality of IEGT chips connected in the power semiconductor device of the 14th embodiment.

The semiconductor element circuit A shown in FIG. 38 may be replaced with a semiconductor element circuit A' shown in FIG. 39. The arrangement of the semiconductor element circuit A' will be explained.

As shown in FIG. 39, the collector terminal C is connected to the collector of the IEGT chip 230 with a current sense function, the collector of an IEGT chip 235, the cathode of the Zener diode ZD, and the collector of the IEGT chip 231. The anode of the Zener diode ZD is connected to the gate of the IEGT chip 231 whose emitter is connected to the emitter terminal E. The emitter of the IEGT chip 230 is connected to the emitter terminal E via the inductance 232, and its sense-side emitter is connected to the gate of the transistor Tr1.

The gate of the IEGT chip 230 is connected to the gate terminal G via the resistors R1 and R2. The collector of the transistor Tr1 is connected to the connection point between the resistors R1 and R2, and its emitter is connected to the emitter terminal E via the resistor R3.

The gate of the IEGT chip 235 is connected via a resistor R4 to the connection point between the resistors R1 and R2, and its emitter is connected to the emitter terminal E via an inductance 236. As shown in FIG. 39, the transistor Tr1 and the resistor R3 constitute the RTC circuit 233, while the Zener diode ZD and the IEGT chip 231 constitute the excessive voltage protective circuit 234.

The operation using the semiconductor element circuit A' is the same as the operation using the semiconductor element circuit A.

According to the 14th embodiment, the induced electromotive force generated in the inductance 232 arranged between the emitter of the IEGT chip 230 and the emitter press-contacting electrode plate 242 can suppress the steep current change (di/dt) upon an OFF operation, and can further suppress a steep voltage change (dv/dt) caused by the current change (di/dt). Consequently, the IEGT chip 230 can be prevented from destruction. The power semiconductor device comprises m×n semiconductor element circuits A or A' and the excessive voltage protective circuit 234, and thus can control a larger power.

The effects of the 13th and 14th embodiments will be explained with reference to a conceptual view showing circuit connection, and a graph showing variations in gate voltage and collector current.

Figure 40:
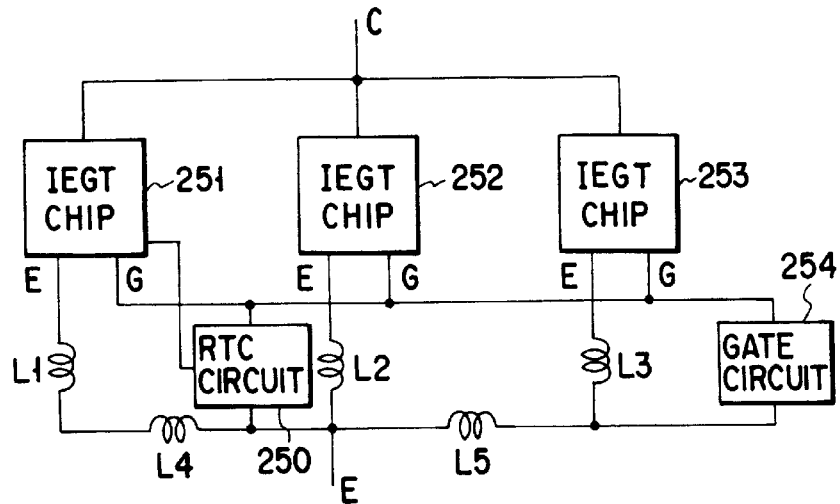
FIG. 40 is a diagram showing an example of IEGT chips arranged simply two-dimensionally.

FIG. 40 is a diagram showing an example of IEGT chips arranged simply two-dimensionally. As shown in FIG. 40, an IEGT chip 251 with a current sense function connected to an RTC circuit 250, and IEGT chips 252 and 253 not connected to the RTC circuit 250 are aligned simply two-dimensionally. The collectors of the IEGT chips 251, 252, and 253 are connected to a collector terminal C, and their gates are connected to a gate circuit 254, which is connected to an emitter terminal E by an emitter line.

The emitters of the IEGT chips 251, 252, and 253 are connected to the emitter terminal E. The RTC circuit 250 is connected between a gate line connecting the gates of the IEGT chips 251, 252, and 253 and the gate circuit 254, and the emitter line connecting the emitters thereof and the gate circuit 254. The RTC circuit 250 is further connected to the sense-side emitter of the IEGT chip 251.

When IEGT chips are simply two-dimensionally wired, the wiring (to be referred to as emitter wiring hereinafter) lengths from the emitters of the IEGT chips 251, 252, and 253 to the emitter terminal E are different. For this reason, as shown in FIG. 40, the emitter lines comprise different inductances L1, L2, L3, L4, and L5 for the respective IEGT chips.

Figure 41A:
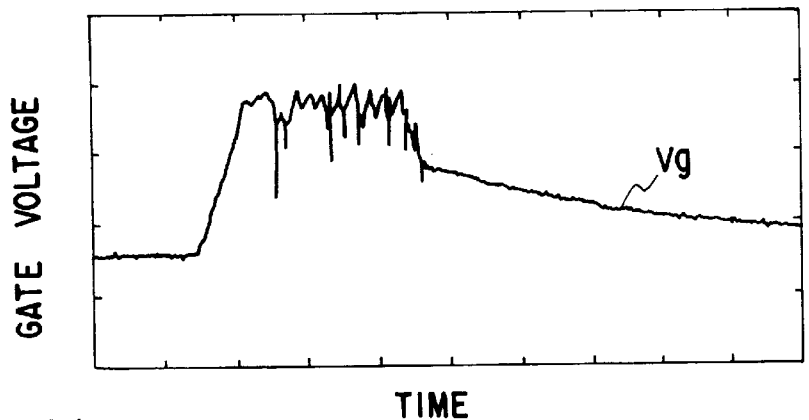
FIG. 41A is a graph showing oscillation of the gate voltage in the example shown in FIG. 40.
Figure 41B:
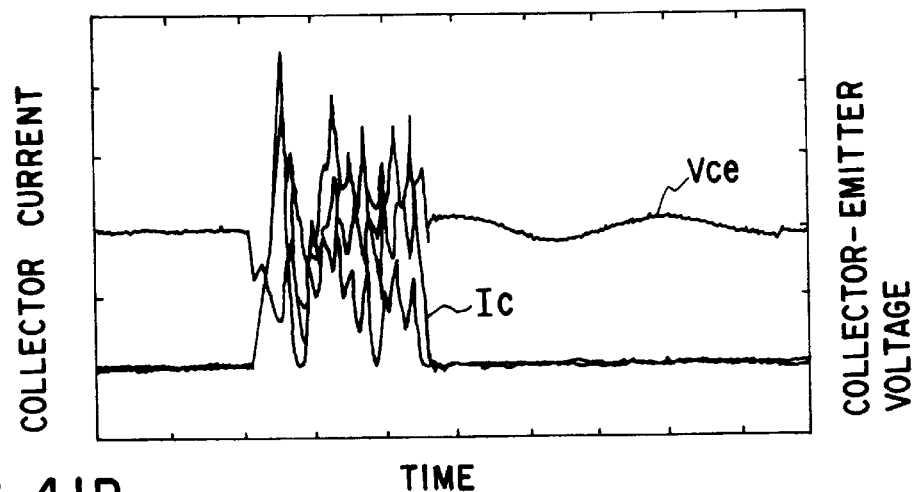
FIG. 41B is a graph showing oscillation of the collector current and the collector-emitter voltage in the example shown in FIG. 40.

Upon operation of the RTC circuit 250, the gate voltage, the collector current, and the collector-emitter voltage oscillate, as shown in FIGS. 41A and 41B. FIG. 41A is a graph showing the waveform of a gate voltage Vg upon operation of the RTC circuit. As shown in FIG. 41A, the gate voltage Vg apparently oscillates.

FIG. 41B is a graph showing the waveforms of a collector current Ic and a collector-emitter voltage Vce upon operation of the RTC circuit 250. As shown in FIG. 41B, the collector current Ic and the collector-emitter voltage Vce apparently greatly oscillate.

The three-dimensional arrangement of IEGT chips will be explained below.

Figure 42:
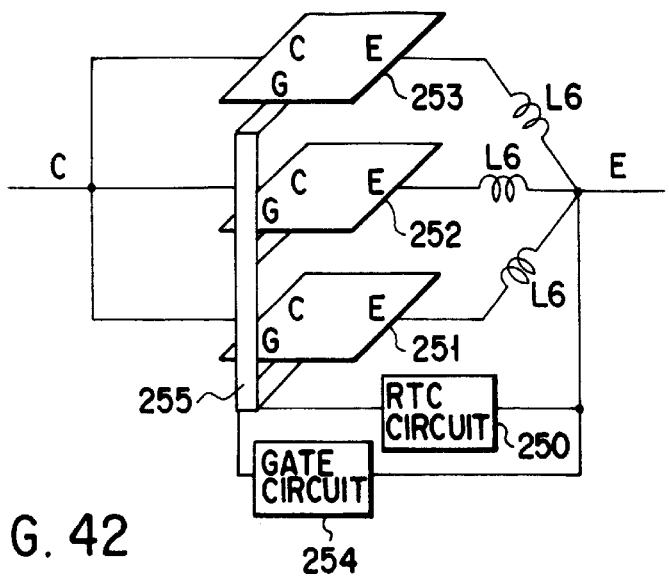
FIG. 42 is a view showing an example of IEGT chips arranged vertically three-dimensionally.

FIG. 42 is a view showing an example of IEGT chips arranged vertically three-dimensionally. As shown in FIG. 42, the IEGT chip 251 with a current sense function connected to the RTC circuit 250, and the IEGT chips 252 and 253 not connected to the RTC circuit 250 are aligned vertically three-dimensionally.

The collectors of the IEGT chips 251, 252, and 253 are connected to the collector terminal C, and their gates are connected to the gate circuit 254. The RTC circuit 250 and the gate circuit 254 are connected to the emitter terminal E. The emitters of the IEGT chips 251, 252, and 253 are connected to the emitter terminal E. A holder 255 shown in FIG. 42 three-dimensionally holds the IEGT chips 251, 252, and 253.

When IEGT chips are three-dimensionally wired, the emitter wiring lengths of the IEGT chips 251, 252, and 253 are equal to each other. For this reason, as shown in FIG. 42, these emitter wires have identical inductances L6 for the respective IEGT chips. In addition, the wiring (to be referred to as gate wiring hereinafter) lengths from the gates of the IEGT chips 251, 252, and 253 to the gate circuit 254 are equal to each other.

Figure 43A:
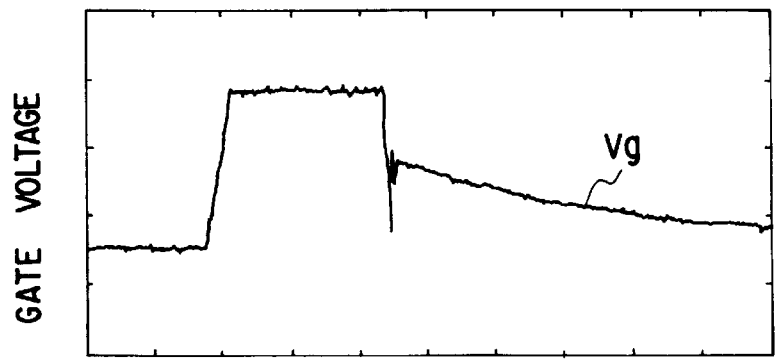
FIG. 43A is a graph showing changes in gate voltage in the example shown in FIG. 42.
Figure 43B:
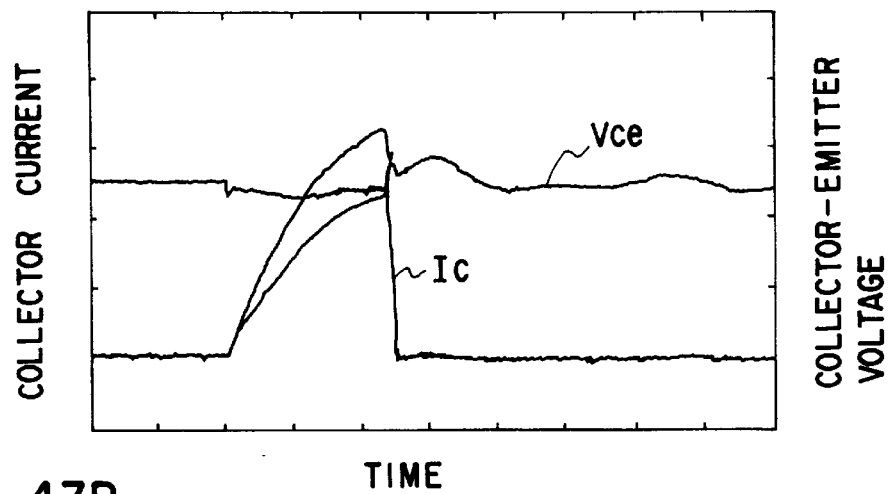
FIG. 43B is a graph showing changes in collector current and collector-emitter voltage in the example shown in FIG. 42.

Upon operation of the RTC circuit 250, no gate voltage, no collector current, and no collector-emitter voltage oscillate, as shown in FIGS. 43A and 43B. FIG. 43A is a graph showing the waveform of the gate voltage Vg upon operation of the RTC circuit. As shown in FIG. 43A, no gate voltage Vg oscillates.

FIG. 43B is a graph showing the waveforms of the collector current Ic and the collector-emitter voltage Vce upon operation of the RTC circuit 250. As shown in FIG. 43B, no collector current Ic and no collector-emitter voltage Vce oscillate. Therefore, in the power semiconductor device in which IEGT chips are three-dimensionally wired, no current oscillation is generated between IEGT chips, and even parallel-connected IEGT chips can be stably protected from an excessive current.

A voltage-driven power semiconductor device according to the 15th embodiment of the present invention will be described. In the 15th embodiment, a plurality of IEGT chips including at least one IEGT chip with a current sense function are parallel-connected (three-dimensionally wired) to make the emitter and gate wiring lengths of the IEGT chips equal. In this power semiconductor device, the emitter wire and the gate wire have equal inductance components.

Figure 44:
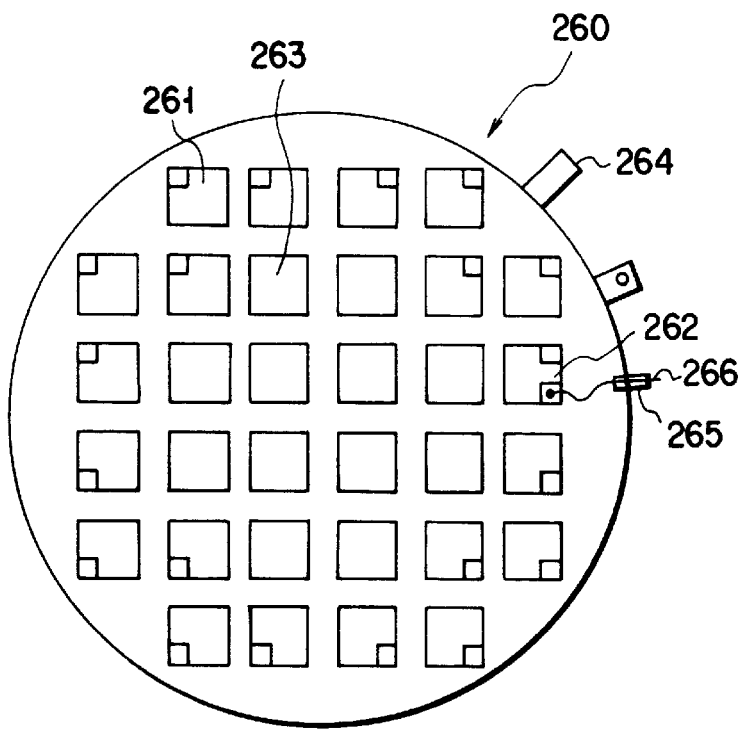
FIG. 44 is a plan view showing the arrangement of a power semiconductor device according to the 15th embodiment of the present invention.

FIG. 44 is a view showing the arrangement of the power semiconductor device according to the 15th embodiment, and is a plan view of a press envelope, viewed from above, from which a collector press-contacting electrode plate is removed. FIG. 44 shows a (so-called C² type) power semiconductor device provided with an RTC circuit outside the envelope.

As shown in FIG. 44, a voltage-driven power semiconductor device 260 comprises IEGT chips 261 as power semiconductor elements, an IEGT chip 262 with a current sense function, and FWD diodes 263. The IEGT chips 261, the IEGT chip 262 with a current sense function, and the FWD diodes 263 are press-contacted by collector and emitter press-contacting electrode plates to constitute the power semiconductor device.

The envelope is provided with a gate terminal 264 connected to the gates of the IEGT chips 261 and the gate of the IEGT chip 262 with a current sense function, and a vacuum port 265 for evacuating the envelope. From the vacuum port 265, a sense terminal 266 connected to the sense-side emitter of the IEGT chip 262 is pulled out. In the power semiconductor device, the RTC circuit is arranged outside the envelope.

Figure 45:
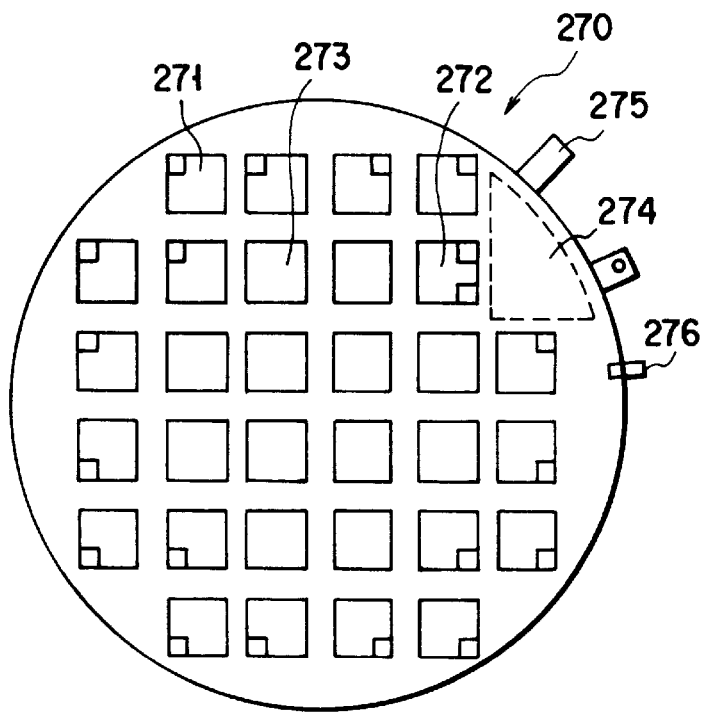
FIG. 45 is a plan view showing the arrangement of the power semiconductor device according to a modification of the 15th embodiment.

FIG. 45 is a view showing the arrangement of the power semiconductor device according to a modification of the 15th embodiment, and is a plan view of a press envelope, viewed from above, from which a collector press-contacting electrode plate is removed.

As shown in FIG. 45, a voltage-driven power semiconductor device 270 comprises IEGT chips 271 as power semiconductor elements, an IEGT chip 272 with a current sense function, and FWD diodes 273. An RTC circuit 274 connected to the emitter and gate lines is arranged near the IEGT chip 272. The IEGT chips 271, the IEGT chip 272 with a current sense function, and the FWD diodes 273 are press-contacted by collector and emitter press-contacting electrode plates to constitute the power semiconductor device.

The envelope is provided with a gate terminal 275 connected to the gates of the IEGT chips 271 and the gate of the IEGT chip 272 with a current sense function, and a vacuum port 276 for evacuating the envelope. As described above, in this power semiconductor device, the RTC circuit is formed inside the envelope.

In the voltage-driven power semiconductor device having the arrangement shown in FIG. 44 or 45, when the current between IEGT chips oscillates upon operation of the RTC circuit, the inductance component of the emitter wire generates an induced electromotive force in a current blocking direction. This induced electromotive force reversely biases the voltage applied to the gate of the IEGT chip. A steep current change (di/dt) upon an OFF operation generates a similar induced electromotive force on the emitter wiring having an inductance component. These induced electromotive forces can suppress current oscillation between IEGT chips upon operation of the RTC circuit, and can also suppress a steep current change (di/dt) upon generation of an excessive current.

According to the 15th embodiment and its modification, when the current between IEGT chips oscillates upon operation of the RTC circuit, the gate voltage is biased in a direction in which the current in the inductance component of the emitter press-contacting electrode plate is blocked, thereby preventing the steep current change (di/dt) upon generation of an excessive current. As a result, current oscillation between IEGT chips upon operation of the RTC circuit can be suppressed, and IEGT chips can be stably protected from an excessive current.

Giving at least one of IEGT chips a current sense function can greatly improve the excessive current protective function of the power semiconductor device. When an excessive element current flows to cause, e.g., short-circuiting, the power semiconductor device having this IEGT chip can be more reliably protected from the excessive current than a power semiconductor device having an IGBT chip.

Figure 46:
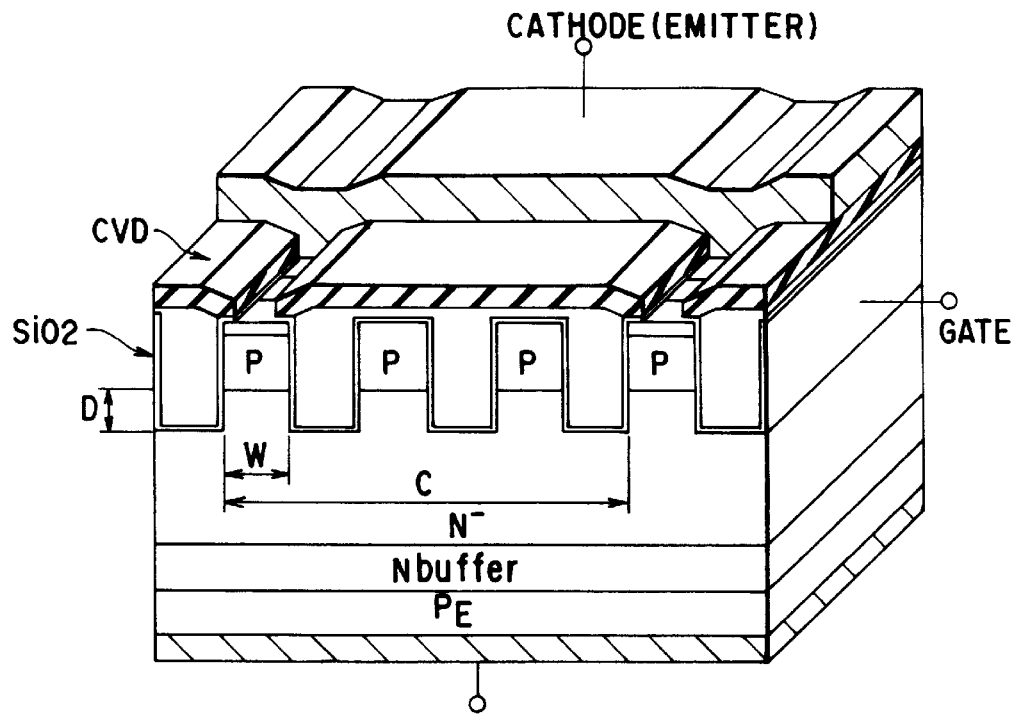
FIG. 46 is a perspective view showing the sectional structure of an IEGT used in the present invention.
Figure 47:
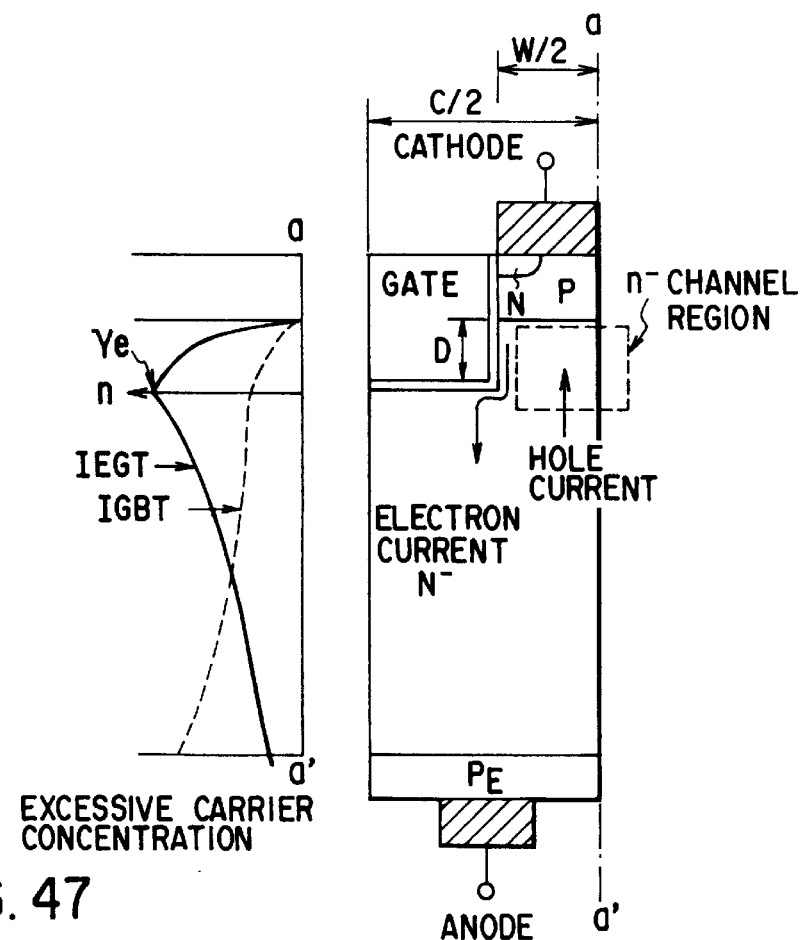
FIG. 47 is a view showing the carrier distribution in the ON state of the IEGT.

An IEGT as a voltage-driven power semiconductor element used in the above embodiments will be explained. FIG. 46 is a perspective view showing the sectional structure of the IEGT. FIG. 47 is a view showing the carrier distribution in the ON state of the IEGT.

As shown in FIG. 46, the IEGT serving as a voltage-driven power semiconductor element comprises insulated gates buried in the surface of a high-resistance base layer at a predetermined interval, an emitter layer of the first conductivity type formed in a region between the insulated gates, a channel region induced by the insulated gates to inject carriers of the first conductivity type from the emitter layer of the first conductivity type to the high-resistance base layer, an emitter layer of the second conductivity type for injecting carriers of the second conductivity type to the high-resistance base layer, and a drain layer of the second conductivity type formed in a region between the insulated gates to drain carriers of the second conductivity type from the high-resistance base layer. Letting 2C be the distance between the drain layers of the second conductivity type, 2W be the width of the region surrounded by the gates, and D be the distance from the interface of the drain layer of the second conductivity type and the high-resistance base layer to the distal end of the insulated gate, X=W/D·C is set to $1.0 \times 10^3$ cm$^{-1}$.

The IEGT constituted in this manner has the following features. γe in FIG. 47 represents the electron injection efficiency on the cathode (emitter) side and is defined by γe=(electron current/total current). The IEGT is characterized by γe=0.73 or more.

The present invention exhibits effects upon application to the IEGT, but is also applicable to another MOS gate semiconductor element such as an IGBT, an MCT, or an EST. The same effects can be obtained even when the present invention is applied to another MOS gate semiconductor element such as an IGBT, an MCT, or an EST.

As has been described above, according to the present invention, in a voltage-driven power semiconductor device constituted by parallel-connecting a plurality of voltage-driven power semiconductor elements, a voltage proportional to the current change (di/dt) of each power semiconductor element is fed back to the gate circuit. Consequently, the current balance between the power semiconductor elements upon switching can be improved, the voltage change (dv/dt) and the current change (di/dt) can be suppressed, and the breakdown voltage of the voltage-driven power semiconductor device can be abruptly improved.

According to the present invention, the power semiconductor element can be effectively prevented from being destructed by variations in current and voltage upon switching between a plurality of power semiconductor elements parallel-connected in the power semiconductor package.

Moreover, according to the present invention, giving at least one of IEGT chips a current sense function can greatly improve the excessive current protective function of the power semiconductor device. When an excessive element current flows to cause, e.g., short-circuiting, the power semiconductor device having an IEGT chip as a power semiconductor element can be more reliably protected from the excessive current than a power semiconductor device having an IGBT chip.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A voltage-driven power semiconductor device, comprising:
   an injection enhanced gate transistor (IEGT) having a gate, a collector and an emitter, said IEGT having a greater emitter-side carrier accumulation effect than that of an insulated gate bipolar transistor (IGBT) in an ON state;
   a collector electrode terminal connected to the collector of the IEGT;
   connection means having an inductance component connected to the emitter of the IEGT; and
   an emitter electrode terminal connected to the connection means.

2. The semiconductor device of claim 1, wherein said IEGT has a current sense terminal, and
   said current sense terminal outputs a sense signal with which a current flowing through the IEGT is controlled to be less than a predetermined value.

3. The semiconductor device of claim 1, wherein said connection means comprises foil.

4. The semiconductor device of claim 1, wherein said emitter electrode terminal is a plate-like terminal, and
   said connection member includes a post member formed on part of the emitter electrode terminal and a magnetic member located around the post member.

5. The semiconductor device of claim 1, wherein said connection means comprises a spiral copper plate coated with an insulating material.

6. A voltage-driven power semiconductor device, comprising:
   a voltage-driven power semiconductor element which is formed as a chip and has a collector on one surface thereof and an emitter on another surface opposing said one surface;
   a plate-like collector electrode terminal arranged on a collector side of the power semiconductor element and electrically connected to the collector;
   connection means having an inductance component electrically connected to the emitter of the power semiconductor element; and
   a plate-like emitter electrode terminal arranged on an emitter side of the power semiconductor element and electrically connected to the connection means.

7. The semiconductor device of claim 6, wherein the plate-like collector electrode terminal and the collector of the power semiconductor element are electrically connected together by exerting pressure on the collector with the collector electrode terminal, and
   the plate-like emitter electrode terminal and the connection means are electrically connecter together by exerting pressure on the connection means with the emitter electrode terminal.

8. The semiconductor device of claim 6, wherein said power semiconductor element has a current sense terminal, and
   said current sense terminal outputs a sense signal with which a current flowing through the power semiconductor element is controlled to be less than a predetermined value.

9. The semiconductor device of claim 6, wherein said connection means comprises foil.

10. The semiconductor device of claim 6, wherein said connection means includes a post member formed on part of the emitter electrode terminal and a magnetic member located around the post member.

11. The semiconductor device of claim 6, wherein said connection means comprises a spiral copper plate coated with an insulating material.

12. A voltage-driven power semiconductor device, comprising:
   an injection enhanced gate transistor (IEGT) having a collector on one surface thereof and an emitter on another surface opposing said one surface, said IEGT having a greater emitter-side carrier accumulation effect than that of an insulated gate bipolar transistor (IGBT) in an ON state;
   a plate-like collector electrode terminal arranged on a collector side of the power semiconductor element and electrically connected to the collector;
   connection means having an inductance component electrically connected to the emitter of the power semiconductor element; and
   a plate-like emitter electrode terminal arranged on an emitter side of the power semiconductor element and electrically connected to the connection means.

13. The semiconductor device of claim 12, wherein the plate-like collector electrode terminal and the collector of the power semiconductor element are electrically connected together by exerting pressure on the collector with the collector electrode terminal, and
   the plate-like emitter electrode terminal and the connection means are electrically connected together by exerting pressure on the connection means with the emitter electrode terminal.

14. The semiconductor device of claim 12, wherein said IEGT has a current sense terminal, and
   said current sense terminal outputs a sense signal with which a current flowing through the IEGT is controlled to be less than a predetermined value.

15. The semiconductor device of claim 12, wherein said connection means comprises foil.

16. The semiconductor device of claim 12, wherein said connection means includes a post member formed on part of the emitter electrode terminal and a magnetic member located around the post member.

17. The semiconductor device of claim 12, wherein said connection means comprises a spiral copper plate coated with an insulating material.

18. A voltage-driven power semiconductor device, comprising:
   a plurality of injection enhanced gate transistors (IEGTs ) each of which is formed as chip and has a collector on one surface thereof and an emitter on another surface opposing said one surface, each of said IEGTs having a greater emitter-side carrier accumulation effect than that of an insulated gate bipolar transistor (IGBT) in an ON state;
   a plate-like collector electrode terminal arranged on a collector side of each of the IEGTs and electrically connected to the collector of each IEGT;
   a plurality of connection means having inductance components electrically connected to the emitters of the IEGTs, respectively; and
   a plate-like emitter electrode terminal arranged on an emitter side of each of the IEGTs and electrically connected to said plurality of connection means, respectively.

19. The semiconductor device of 18, wherein the plate-like collector electrode terminal and the collectors of the IEGTs are electrically connected together in parallel by exerting pressure on the collectors with the collector electrode terminal, and the plate-like emitter electrode terminal and said plurality of connection means are electrically connected together in parallel by exerting pressure on the connection means with the emitter electrode terminal.

20. The semiconductor device of 18, wherein at least one IEGT among said IEGTs has a current sense terminal, and said current sense terminal outputs a sense signal with which a current flowing through said at least one IEGT is controlled to be less than a predetermined value.

21. The semiconductor device of 18, wherein said connection means comprises foil.

22. The semiconductor device of 18, wherein said connection means include a post member formed on part of the plate-like emitter electrode terminal and a magnetic member located around the post member.

23. The semiconductor device of 18, wherein said connection means comprises a spiral copper plate coated with an insulating material.

24. A voltage-driven power semiconductor device, comprising:

a voltage-driven power semiconductor element which is formed as a chip and has a collector on one surface thereof and an emitter on another surface opposing said one surface;

a plate-like collector electrode terminal arranged on a collector side of the power semiconductor element and electrically connected to the collector; and a plate-like emitter electrode terminal arranged on an emitter side of the power semiconductor element and electrically connected to the connection means, wherein said power semiconductor device is fabricated as a press-contacting type package, the plate-like collector electrode terminal and the collector of the power semiconductor element are electrically connected together by exerting pressure on the collector with the collector electrode terminal, and the plate-like emitter electrode terminal and the emitter of the power semiconductor element are electrically connected together by exerting pressure on the emitter with the emitter electrode terminal.

25. The semiconductor of claim 24, wherein said power semiconductor element has a current sense terminal, and said current sense terminal outputs a sense signal with which a current flowing through the power semiconductor element is controlled to be less than a predetermined value.

\* \* \* \* \*